United States Patent [19]
Steiner

[11] Patent Number: 4,700,319
[45] Date of Patent: Oct. 13, 1987

[54] ARITHMETIC PIPELINE FOR IMAGE PROCESSING

[75] Inventor: Walter R. Steiner, Ormond Beach, Fla.

[73] Assignee: The United States of America as represented by the Secretary of the Air Force, Washington, D.C.

[21] Appl. No.: 741,644

[22] Filed: Jun. 6, 1985

[51] Int. Cl.$^4$ .......................... G06F 7/38; G06K 9/36
[52] U.S. Cl. .................................... 364/518; 364/736; 364/752; 382/41; 382/54
[58] Field of Search ............... 364/518, 736, 748, 752, 364/753; 382/41, 54

[56] References Cited

U.S. PATENT DOCUMENTS

| | | | |
|---|---|---|---|
| 3,560,726 | 2/1971 | Platt et al. | 235/197 |
| 3,631,230 | 12/1971 | Chen | 364/752 |
| 3,789,203 | 1/1974 | Catherall | 235/152 |
| 3,940,603 | 2/1976 | Smith | 235/195 |
| 3,965,344 | 6/1976 | Romo | 235/197 |
| 3,988,600 | 10/1976 | Katsuoka et al. | 235/150.53 |
| 4,143,363 | 3/1979 | Dotter, Jr. | 340/347 AD |
| 4,225,933 | 9/1980 | Monden | 364/753 |
| 4,300,203 | 11/1981 | Brown | 364/577 |
| 4,366,548 | 12/1982 | Kregness et al. | 364/748 |
| 4,433,438 | 2/1984 | Couturier | 382/54 |
| 4,583,180 | 4/1986 | Kmetz | 364/748 |
| 4,592,006 | 5/1986 | Hagiwara et al. | 364/748 |

OTHER PUBLICATIONS

Brubaker et al., "Multiplication Using Logarithms Implemented with Read-Only Memory", IEEE Transactions on Computers, vol. C-24, No. 8, Aug. 1975, pp. 761-765.

Hall et al., "Generation of Products and Quotients Using Approximate Binary Logarithms for Digital Filtering Applications", IEEE Transactions on Computers, vol. C-19, No. 2, Feb. 1970, pp. 97-105.

Primary Examiner—Errol A. Krass
Assistant Examiner—Daniel W. Juffernbruch
Attorney, Agent, or Firm—Bernard E. Franz; Donald J. Singer

[57] ABSTRACT

The arithmetic pipeline processor (which is used for computer graphics such as a flight simulator) is a group of boards capable of solving an equation of the form $$A^m B^n + C^o D^p + E^q F^r + G^s H^t$$

where A, B, C, D, E, F, G, H are 32-bit implied one floating point numbers, and m, n, o, p, q, r, s, t can take on the values $\frac{1}{4}$, $\frac{1}{2}$, 1, 2 and 0. It includes a digital logarithmic calculator using shifters and stored tables to perform arithmetic functions such as multiplication, division, squares, square roots, and fourth roots. It comprises two input ports each capable of receiving digital data N bits wide. Included are a log transform unit, a log sum or difference unit and an antilog unit. Following these is an M-bit Aritmetic Logic Unit (ALU) and circuitry for converting between fixed point and floating point numbers. It uses piece wise linear approximation in conjunction with stored slope information in tables to do the transform calculation of logarithms and antilogarithms. The M-bit arithmetic unit performs accumulation of up to K terms. In a specific emodiment, N=32, M=36, and K=128. Note that a pipeline processor has no central processing unit or software in itself, but it may interface with a computer for inputs and outputs including control information.

4 Claims, 15 Drawing Figures

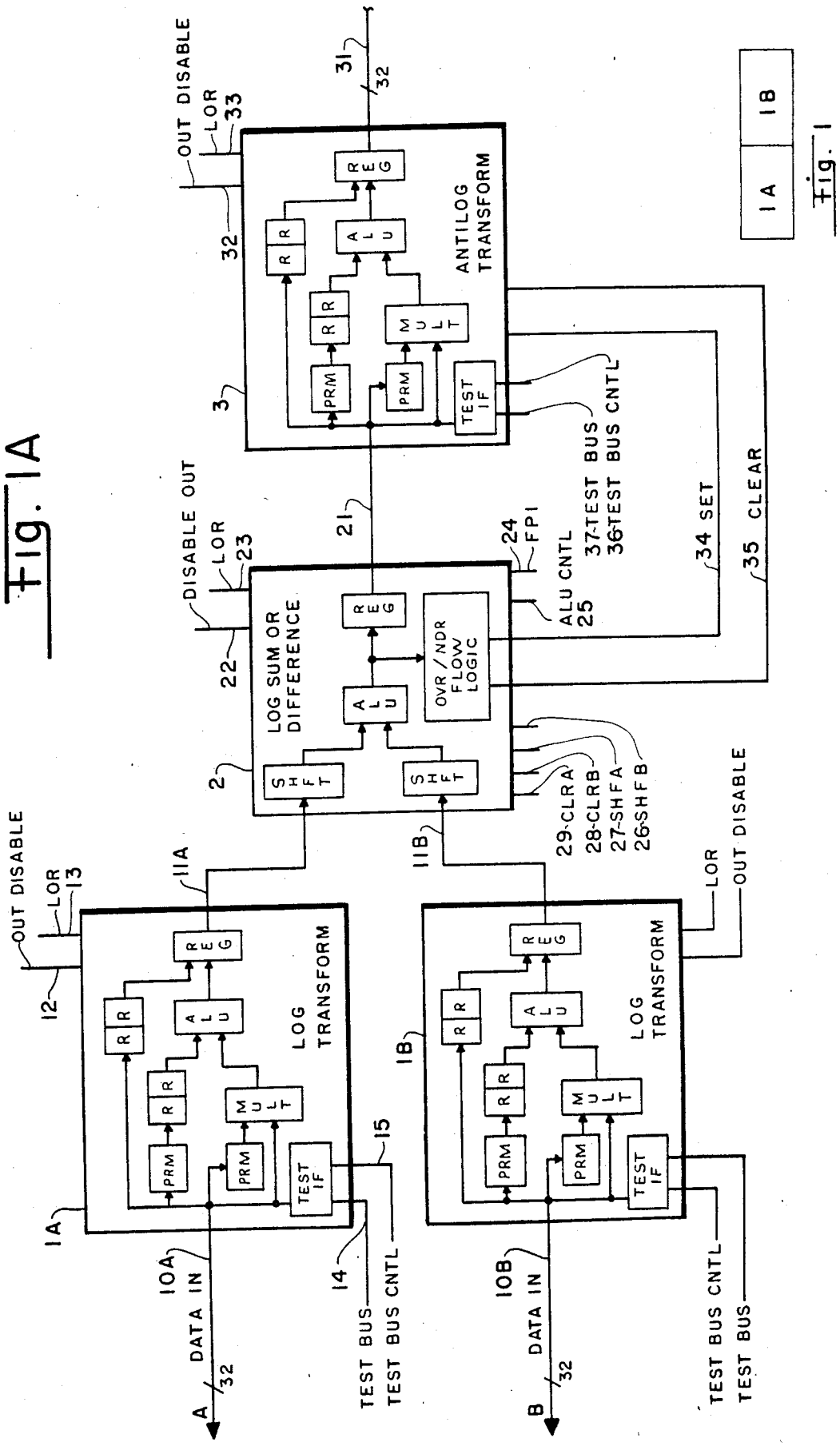

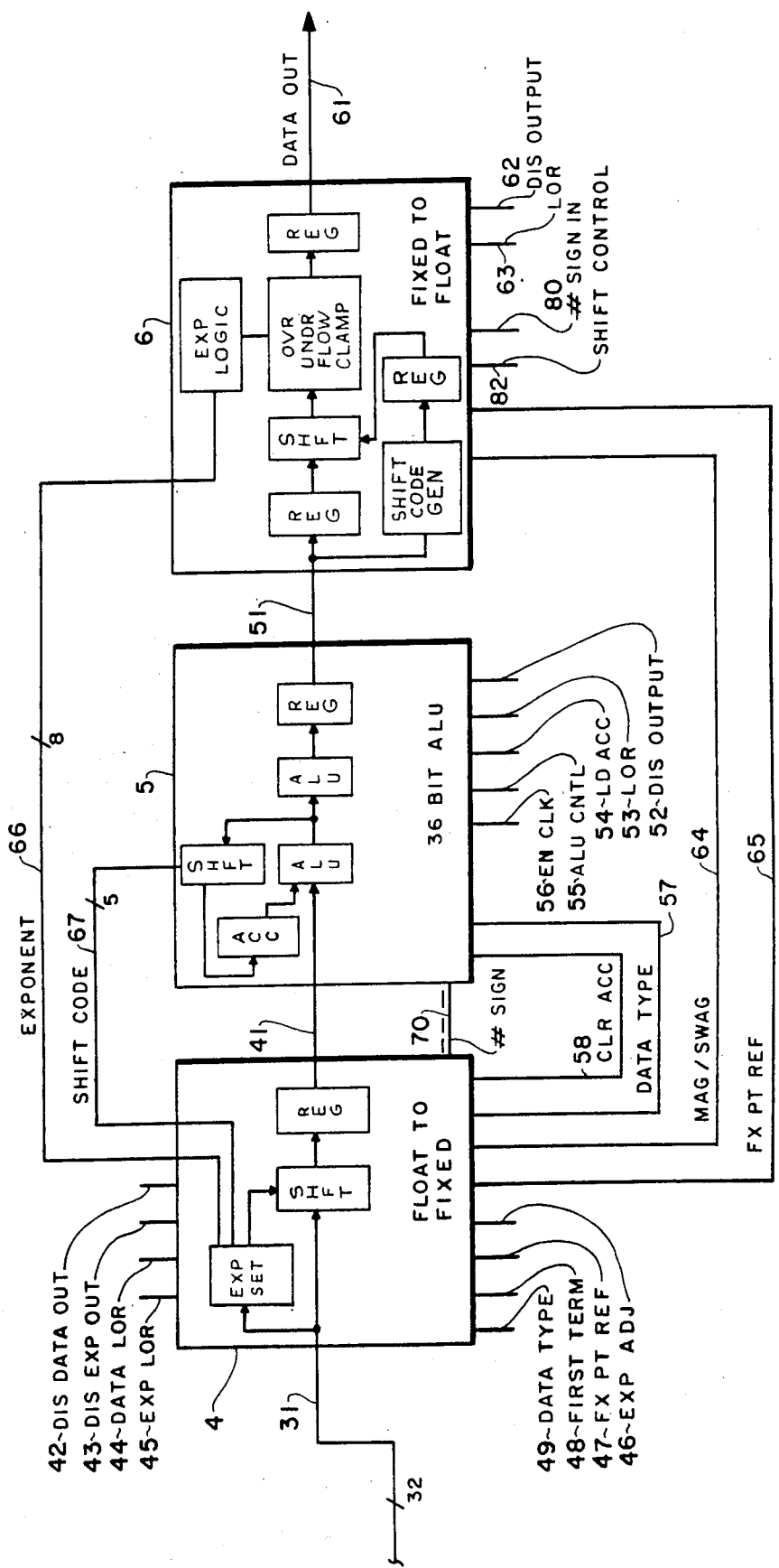

| CLOCK | 1 | 2 | 3 | 4 | 5 | 6 | 7 | 8 | 9 | 10 | 11 | 12 |
|---|---|---|---|---|---|---|---|---|---|---|---|---|
| BOARD | LOG | LOG | LOG | LOG +/- | ALOG | ALOG | ALOG. | FLOAT → FIX | ALU | FIX → FLOAT | FIX → FLOAT | |
| CONTROL SIGNAL | | | | | | | | | | | | |
| A DATA, B DATA, LOG TEST BUS AND CNTL | VALID | | | | | | | | | | | |
| CLRA, CLRB, SHFA, SHFB, LOG +/- ALU CNTL | | VALID | | | | | | | | | | |
| FPI, ALOG TEST BUS AND CNTL | | | | VALID | | | | | | | | |
| DATA TYPE | | | | | VALID | | | | | | | |
| ALU CNTL, FX FT REF | | | | | | VALID | VALID | | | | | |
| EXPONENT ADJUST | | | | | | | | VALID | | | | |
| OUTPUT DATA | | | | | | | | | VALID | | | VALID |
| LOG LOR | | | | | | | | | | | | |
| LOG +/- LOR | | | | | | | | | | | | |
| ALOG LOR, FIRST TERM | | | | | | | | | | | | |
| FLOAT → FIX LOR | | | | | | | | | | | | |
| ALU LOR, EXP LOR | | | | | | | | | | | | |
| FIX → FLOAT LOR | | | | | | | | | | | | |
| DISABLE LOG OUTPUT | | | | | | | | | | | | |
| DISABLE LOG +/- OUTPUT | | | | | | | | | | | | |
| DISABLE ALOG OUTPUT | | | | | | | | | | | | |
| DISABLE FLOAT → FIX OUTPUT | | | | | | | | | | | | |
| DISABLE ALU OUTPUT, DISABLE EXP OUT | | | | | | | | | | | | |
| DISABLE FIX → FLOAT OUTPUT | | | | | | | | | | | | |

Fig. 2

OUT OF RANGE DETECTION

SPECIAL CASE DETECTION

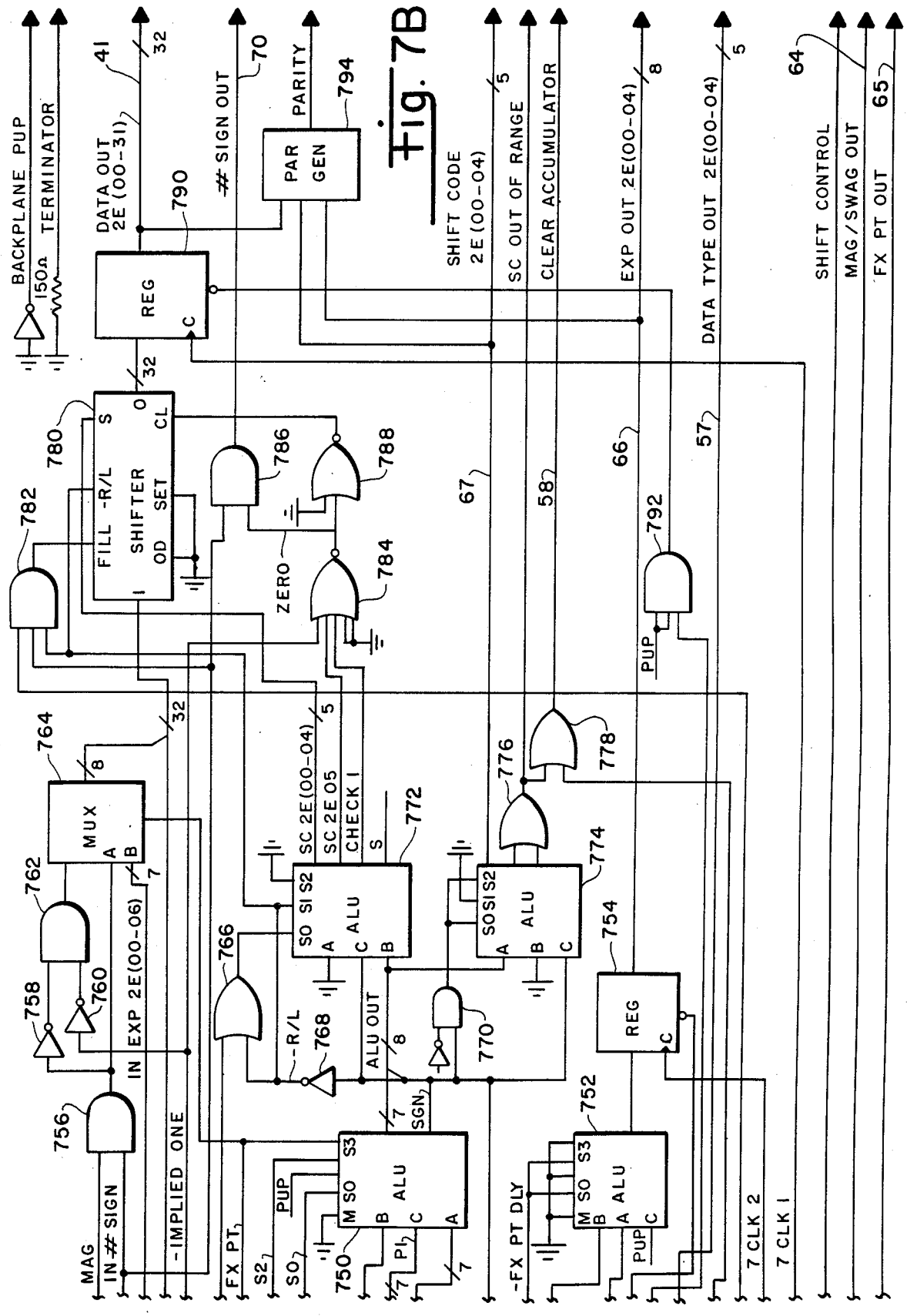

ARITHMETIC PIPELINE FOR IMAGE PROCESSING

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of computer graphics; particularly to an arithmetic pipeline form of image processing circuits, using intergrated circuits, for solving an equation of the form $A^m B^n + C^o D^p + E^q F^r + G^s H^t \ldots$.

Flight simulation is one form of computer graphics which requires image processing in real time, and is very complex. Functions such as windowing, transformations, and clipping may use the above form of equation.

An example of an arithmetic pipeline is shown by Courturier in U.S. Pat. No. 4,433,438, "Sobel Edge Extraction Circuit for Image Processing", issued Feb. 21, 1984. which includes simplified look-up tables in read only memory for performing a squaring function.

Other U.S. patents of interest relating to arithmetic signal processing circuits include U.S. Pat. No. 3,789,203 to Catherall et al, which discloses a logic system for generating a variety of functions by approximation and interpolation. The patented circuit includes elements of electronic data processing such as shift registers, adders, and the like to perform the interpolation involving addition, subtraction and division by 2. The algorithm of the reference is described as an add-shift algorithm. A digital logarithmic function generator is taught by Katsuoka et al in U.S. Pat. No. 3,988,600. In Dotter, Jr. (U.S. Pat. No. 4,143,363) a piece-wise linear process is used to translate between analog and digital signals. Platt (U.S. Pat. No. 3,560,726) generates the approximation of a function by adding straight line segments, each characterized by a gating point and a slope. A summing amplifier adds the segments to form the prescribed function. A computer which generates logarithmic and root functions is taught by Romo in U.S. Pat. No. 3,965,344. Brown (U.S. Pat. No. 4,300,203) combines a log converter with a microcomputer to perform a linear interpolation and Smith (U.S. Pat. No. 3,940,603) combines a plurality of log circuits to perform multiplication and division.

SUMMARY OF THE INVENTION

An object of the invention is to provide an arithmetic processor for a computer graphics system (such as a flight simulator) which is capable of operating at sufficiently high speed to provide data as needed by the system in real time.

The aritmetic pipeline processor according to the invention includes a digital logarithmic calculator using shifters and piece-wise linear approximation.

The invention is directed to electrical circuity which uses logarithms to perform arithmetic functions such as multiplication, division, squares, square roots, and fourth roots. It comprises two input ports each capable of receiving digital data N bits wide. Included are a log transform unit, a log sum or difference unit and an antilog unit. Following these is an M-bit Aritmetic Logic Unit (ALU) and circuitry for converting between fixed point and floating point numbers. In the log and antiog transform units, it uses piece wise linear approximation in conjunction with stored slope information in tables to do the transform calculation of logarithms and antilogarithms. The M-bit arithmetic unit performs up to K accumulations. In a specific embodiment, N=32, M=32, and K=128.

BRIEF DESCRIPTION OF THE DRAWING

FIGS. 1A and 1B when arranged as shown in FIG. 1 comprise a system block diagram;

FIG. 2 is a timing diagram;

FIGS. 7A and 7B when arranged as shown in FIG. 7 comprise a block diagram at the IC level for the floating-to-fixed-point board of FIG. 1;

DETAILED DESCRIPTION

I. GENERAL

Figure 4:
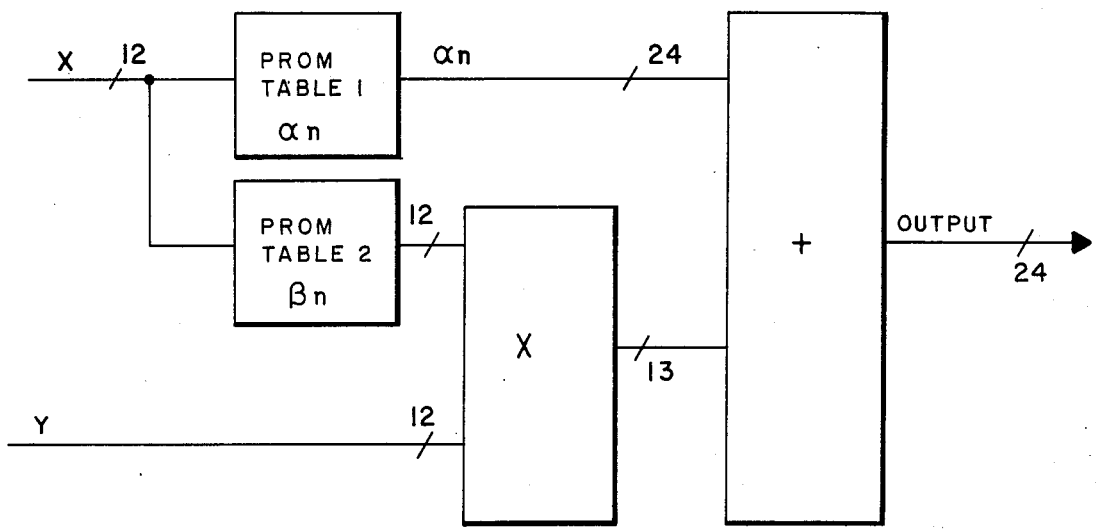
FIG. 4 is a functional block diagram showing the hardware for computing the output value at a given input value for a curve like that in FIG. 3.

The Arithmetic Pipeline, as shown in FIG. 1, is a group of boards capable of solving an equation of the form $$A^m B^n + C^o D^p + E^q F^r + G^s H^t \ldots$$

where A, B, C, D, E, F, G, H are 32-bit implied one floating point numbers, and m, n, o, p, q, r, s, t can take on the values $\frac{1}{4}$, $\frac{1}{2}$, 1, 2 and 0.

The pipeline is capable of dividing, multiplying, subtracting and adding, or any combination of multiplies or divides and additions or subtractions as follows:

$$\sum_{i=1}^{128} +/- (A_i^{mi} \times/\div B_i^{ni})$$

where, $+/-$ indicates either an add or a subtract, and $\times/\div$ indicates a multiply or a divide. The pipeline is capable of calculating the absolute value of any or all of the product terms. The Arithmetic Pipeline also has the capability of converting a 32-bit floating point number to a 32-bit fixed point number with the position of the binary point chosen by the user, or a 32-bit fixed point number to a 32-bit floating point number.

e.g., The pipeline accumulates the sum of K terms (K=128), each term being either positive or negative, and the $i_{th}$ term comprising the factors $A_i^{mi}$ and $B_i^{ni}$ with either a multiplication or a division of the factors.

The subfunctions partitioned to a board level are as follows:

1A and 1B. Log Transform
2. Log Sum or Difference
3. Anti Log
4. Floating to Fixed Point
5. 36 Bit ALU
6. Fixed to Floating Point I-A. System Block Diagram FIG. 1 is a block diagram of the Arithmetic Pipeline. The diagram depicts: Input and Output, Board Functions and all Controls. The diagram shows the board level partitioning and the subfunctions of each board. FIG. 2 is the timing diagram for all the controls on the Arithmetic Pipeline. The timing diagram shows the time at which the control signals are activated as one word traverses the pipeline.

There are two input ports labeled A DATA IN and B DATA IN. These ports are 32 bits wide. The input ports operate at a rate not greater than one 32-bit word per 120 nanoseconds. There is one 32-bit output port labeled DATA OUT that also operates at a rate not greater than one 32-bit word every 120 nanoseconds. The output has the capability of presenting the data in 32-bit implied one floating point format or 32-bit fixed point format. In the fixed point format, the pipeline has the capability of presenting data in either signed magnitude, magnitude, or two's complement notation. The input and output notations are to be selected by the user. There are two 32-bit bidirectional test busses used for test purposes. Each board has a parity output which may interface to a parity collection memory.

The following is a list of boards used in the Arithmetic Pipeline:

| BOARD | QUANTITY |
|---|---|
| 1A, 1B & 3. Transform Board | 3 |
| 2. Log Sum or Difference | 1 |
| 4. Floating to Fixed Point | 1 |
| 5. 32-Bit ALU | 1 |
| 6. Fixed to Floating Point | 1 |

I-B Arithmetic Pipeline Controls

The control lines shown in FIG. 1 are defined below, with the drawing reference character in the left column.

| | | |
|---|---|---|
| SHFA — A Shifter Control | 2 Bits, Controls 4 way shifter on A data input. | |
| | Input | Function |
| | 0 0 | Square A Data |
| | 0 1 | Pass A Data |
| | 1 0 | Square Root A Data |
| | 1 1 | Fourth Root A Data |
| SHFB — B Shifter Control | 2 Bits, Controls 4 way shifter on B data input. | |
| | Input | Function |
| | 0 0 | Square B Data |
| | 0 1 | Pass B Data |
| | 1 0 | Square Root B Data |
| | 1 1 | Fourth Root B Data |
| ALU CNTL — (Log +/−) | 2 Bits, Controls ALU on log sum or difference board. | |
| | Input | Function |
| | 0 1 | A + B |
| | 0 1 | A − B |
| | 1 0 | B − A |
| | 1 1 | Reset |
| CLRA — Clear A | Clear A Input | |
| CLRB — Clear B | Clear B Input | |
| FIRST TERM | Denotes the first term in a series of accumulations. Used to initialize exponent select logic and accumulator. | |

-continued

| | | |
|---|---|---|
| DATA TYPE | 5 Bits, used to designate the data type of the input and output of the floating point accumulator. | |
| Data type | Input | Output |
| 0 0 0 0 | Floating Point | Floating Point |
| 0 0 0 1 | Floating Point | Signed Magnitude |
| 0 0 1 0 | Floating Point | 2's Complement |
| 0 0 1 1 | Floating Point | Magnitude |
| 0 1 0 1 | Signed Magnitude | Floating Point |
| 0 1 1 0 | Signed Magnitude | Signed Magnitude |
| 0 1 1 0 | Signed Magnitude | 2's Complement |
| 0 1 1 1 | Signed Magnitude | Magnitude |
| 1 0 0 0 | 2's Complement | Floating Point |
| 1 0 0 1 | 2's Complement | Signed Magnitude |
| 1 0 1 0 | 2's Complement | 2's Complement |
| 1 0 1 1 | 2's Complement | Magnitude |
| 1 1 0 0 | Magnitude | Floating Point |
| 1 0 1 0 | Magnitude | Signed Magnitude |
| 1 1 1 0 | Magnitude | 2's Complement |
| 1 1 1 1 | Magnitude | Magnitude |
| 1 0 0 0 0 | Flt Pt (2's Comp) | Flt Pt (2's Comp) |
| 1 0 0 0 1 | Flt Pt (2's Comp) | Signed Magnitude |
| 1 0 0 1 0 | Flt Pt (2's Comp) | 2's Complement |
| 1 0 0 1 1 | Flt Pt (2's Comp) | Magnitude |
| 1 0 1 0 0 | Floating Point | Flt Pt (2's Comp) |
| 1 0 1 0 1 | Flt Pt (2's Comp) | Floating Point |
| 1 0 1 1.0 | Floating Point | 2's Comp (No Sign) |
| FX PT REF | Fixed Point Reference. 7 Bits Allows the user to perform a floating point to fixed point conversion with the position of the binary point specified by the fixed point reference. The fixed point reference is a 2's complement number. | |
| FX PT IN | Denotes Input is in Fixed Point | |
| EXP ADJ | (Exponent Adjust) 8 Bits, adds a number to the exponent, usually a seven, to compensate for seven overflow bits in the ALU. | |
| EN CLK | (Enable Clock) Loads the output register of the ALU board. Used to store the output ALU. | |
| LD ACC | Load Accumulator, loads accumulator register. | |
| ALU CNTL | (ALU Board) Controls ALU on 36-Bit ALU Board. | |
| | Input | Function |
| | 0 0 0 0 | B + ACC |
| | 0 0 0 1 | −B + ACC |
| | 0 0 1 0 | ABS (B) + ACC |
| | 0 0 1 1 | −ABS (B) + ACC |
| | 0 1 0 0 | B ⊕ ACC |
| | 0 1 0 1 | B and ACC |
| | 0 1 1 0 | B or ACC |
| | 0 1 1 1 | Clear Output |
| | 1 0 0 0 | Preset Output |
| | 1 0 0 1 | $\overline{B}$ + ACC |
| CLR ACC | Clears accumulator Register | |
| DISABLE OUT X | Tristates output. Each board has one. X is the board number. (DIS DATA OUT on board 5). | |
| LOR X | Load output register. Each board has one. X is the board number. On board 5 DATA LOR and EXP LOR for data and exponent respectively. | |
| FPI | Fixed Point Input | |

| MSB | | 32 BITS | LSB |
|---|---|---|---|
| # SGN | EXP SGN | EXPONENT 2E05–2E00 6 BITS | DATA 24 BITS |

IMPLIED ONE FLOATING POINT FORMAT

-continued

| MSB | 32 BITS | LSB |
|---|---|---|
| # SGN | MAGNITUDE DATA 31 BITS | |

SIGNED MAGNITUDE FORMAT

| MSB | 32 BITS | LSB |
|---|---|---|
| # SGN | 2's COMPLEMENT DATA 31 BITS | |

2's COMPLEMENT DATA

| MSB | 32 BITS | LSB |
|---|---|---|
| MAGNITUDE DATA 32 BITS | | |

MAGNITUDE FORMAT

The Arithmetic Pipeline is divided into two independent sections: Log Operations and Floating Point ALU.

II. LOG OPERATIONS

The log operations section consists of parts for the following functions: log transform, log sum or difference, overflow/underflow clamp, and an antilog transform (refer to FIG. 1). This hardware is capable of executing a multiply (A·B), a divide (A/B), square ($A^2$ and/or $B^2$), square root ($A^{\frac{1}{2}}$ and/or $B^{\frac{1}{2}}$) or fourth root ($A^{\frac{1}{4}}$ and/or $B^{\frac{1}{4}}$) at the rate of one operation per clock.

The input data to the log boards must be in the 32-bit implied one floating point notation in order to perform any log operations mentioned above. Non-implied one floating point data may be passed through the log operation section using the FPI control. This control inhibits the clamp. The output from the antilog board is in implied one floating point notation (FPI=0).

II-A. Log and Antilog Transforms

The log or antilog transform function takes the logarithm or antilogarithm to the base two of a 32-bit number. The transform board is used to approximate the log transform, and the antilog transform. The discussion that follows on the theory of operation of the transform board applies to the log and antilog function.

Transform Operation

Figure 3:
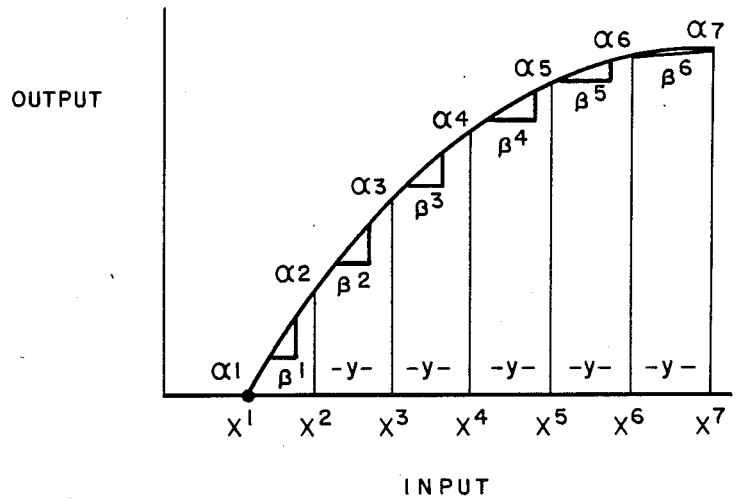
FIG. 3 is a graph showing a desired curve for a transform board.

The Transform Board approximates a desired curve as shown in FIG. 3.

The transform algorithm is as follows: Let the input be a 24-bit binary number. The number is split into the most significant 12 bits called X, and the least significant 12 bits called Y. Then, referring to the FIG. 3, a point on a line segment from $\alpha n+1$ can be described as follows:

$$\text{Outout} = f(\text{input}) \quad (1)$$

$$\text{Output} \simeq f(Xn) + \beta n \cdot (Y) \quad (2)$$

Where $f(Xn) = \alpha n$ $\beta n$ = Slope of the line segment $$\text{Then Output} \simeq n\,\alpha n + \beta n\,(Y) \quad (3)$$

Prom table 1 stores all the f(Xn) or $\alpha n$ values. Since X is 12 bits, there are 4096 $\alpha n$ values ($\alpha_1$ to $\alpha_{4096}$). Prom table 2 stores all the $\beta n$ values (4096 values). For each $\alpha n$ there must be a $\beta n$. Once $\alpha n$ and $\beta n$ are known, equation (3) will be computed as depicted in FIG. 4.

The value of $\alpha n$ must be 24 bits to cover the full range of the curve. The number of bits of the product of $\beta n$ and Y relates to the maximum slope of a line segment. For example, in the figure of the approximated curve, line segment $\alpha_1$ to $\alpha_2$ is the line segment with the greatest slope. Because of this, the output corresponding to this segment wil cover the greatest range of any line segment. The product of $\beta n$ and Y must cover this range. The maximum range of $\alpha n$ to $\alpha n+1$ is dependent on the curve. In the log, antilog, and sine curves the maximum difference is 13 bits. Therefore, the 13 msb's of the output of the multiplier are used. This is a restriction placed on the maximum slope of the curve to be approximated. A subtract instead of an add may be used for negative sloped curves. A proof that equation (3) approximates the log and antilog curves is given in Section IV-A.

Log Transform

The input to the logarithm board is in 32 bit implied one floating point notation. (FPI=0) This notation consists of a 7-bit exponent in two's complement notation, a number sign, and 24 bits of data. The exponent has a base of two. There is a bit that is not shown in the implied one format. This bit can be considered as the MSB of the data and is always high. The binary point is placed after this bit. Since this bit is always high, it need not be written, hence the term implied one. The number sign bit is not used in the log transform; it is simply delayed three times, then output. When a log to the base two is performed on the input, the 7-bit exponent becomes the characteristic and the log of the 24 bits of data becomes the mantissa (as shown in the following illustration).

| # SIGN | EXPONENT | 1. | DATA | Floating point |
|---|---|---|---|---|
| | 7 BITS | | 24 BITS | |

| # SIGN | EXPONENT | DATA | Implied one floating point |
|---|---|---|---|
| | 7 BITS | 24 BITS | |

| # SIGN | CHARACTERISTIC . | LOG (DATA) | Log Domain |
|---|---|---|---|
| | Δ ——— Binary Point | | |

The output of the log board is a 32-bit fixed point number with the binary point placed after the 7-bit characteristic. The characteristic, like the number sign bit, is the exponent delayed three clocks. The number sign is used to determine the sign of a multiply or a divide. This is done by the log sum or difference function.

Since the data is in implied one format, it can range from $1.000000_{16}$ to $1.ffffff_{16}$ or $1.0_{10}$ to $1.9999_{10}$. This means the log must be defined over the range of $1.0_{10}$ to $1.9999_{10}$. Notice that the log of zero or a number less than one, which yields a negative number, can never be taken. The mantissa can range from $000000_{16}$ to $FFFFFF_{16}$ or $0_{10}$ to $0.9999_{10}$.

Antilog Transform

The Antilog Transform will do exactly the opposite of the log transform. A 32 bit fixed point number is applied to the input. The output consists of a 32-bit implied one floating point number.

Transform Board Tables

This board approximates a desired curve using a two term Taylor Series approximation. The most commonly used curves are the logarithm, antilogarithm, and the sine curve. The type of curve to be approximated will be defined by the values in prom tables 1 and 2 (refer to FIG. 4). The add/subtract input is high for negative sloped curves. Each different curve will have a set of proms. In the Arithmetic Pipeline, the logarithm, group 1, and the antilogarithm, group 2 will be used.

Transform Board Structure

Figure 5:
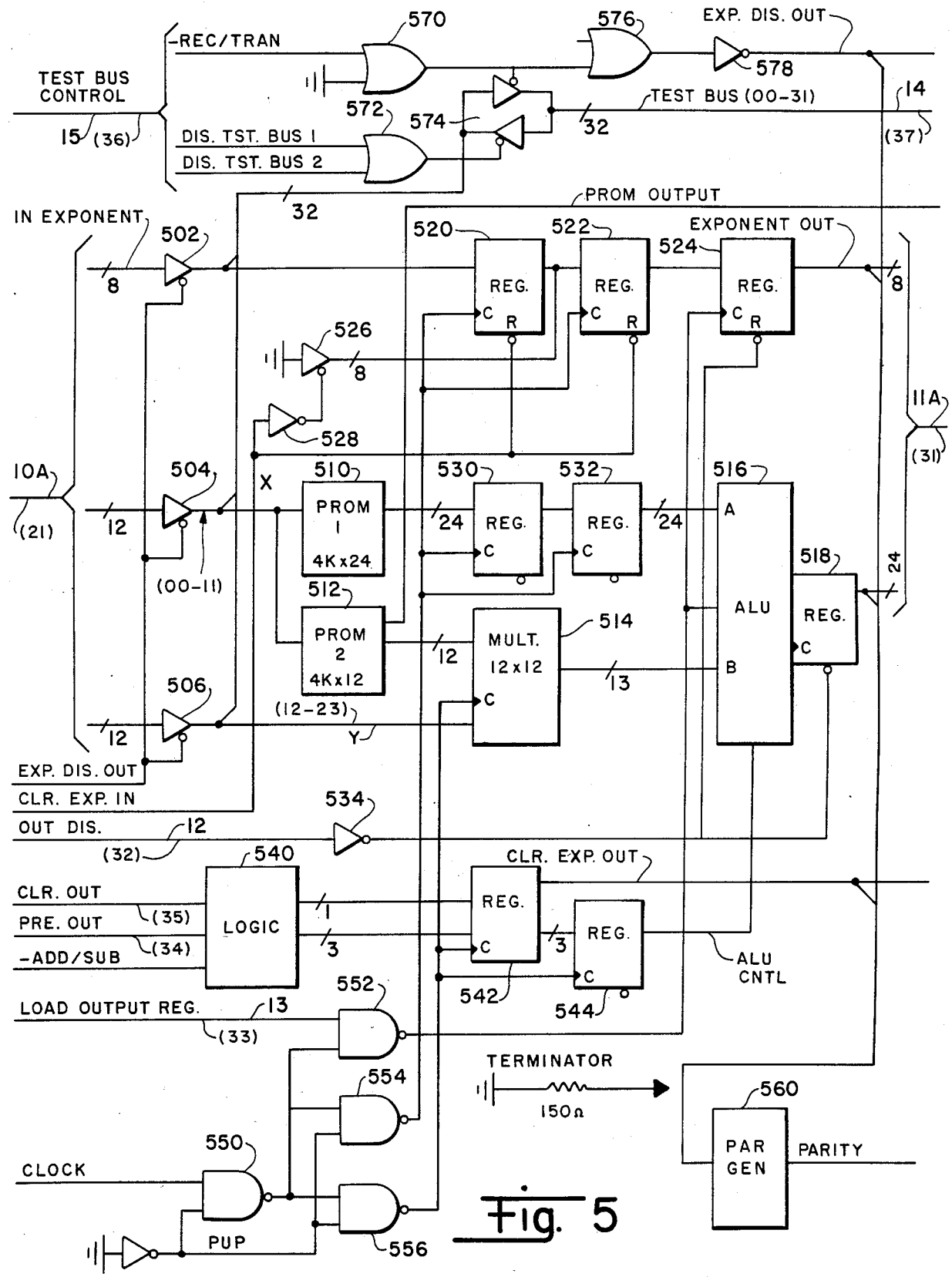
FIG. 5 is a block diagram at the IC level for the transform board of FIG. 1.

A functional block diagram of the transform board is shown in FIG. 5. The reference characters on this figure relate to board 1A of FIG. 1, but boards 1B and 3 are identical, except for the tables for board 3. The gate circuits on this and the other boards 2-6 use integrated circuits of the 74F (Fairchild) family.

The 32 leads of the A DATA IN line 10A are connected to input devices shown as triangles 502, 504, & 506, which represent 32 receivers on four IC chips type 74LS245, Octal Bidirectional Transceivers. The outputs of these receivers are also connected via another four type 74LS245 chips 574 in a bidirectional configuration to a 32-conductor test bus 14.

The two devices 510 and 512 are the PROM table 1 and PROM table 2 shown in FIG. 4. They are IC type 3632, with three chips for device 510 and two chips for device 512. The 12×12 multiplier 514 is an IC type MPYHJ12. The arithmetic logic unit 516 comprises five IC chips type 74F382. The board has several registers using Octal D Latch IC chips, which comprise positive edge-triggered flip-flops. Register 520, 522, 530 & 532 are type 74LS374; and registers 518, 524, 542 & 544 are type 74F374; registers 530, 532 & 518 each comprising three chips. A Field Programmable Logic Array 540 is IC types FLPA. A parity generator 560 comprises three chips of IC type 93S48.

The outputs from the receivers of devices 502-506 have 8 leads for the "in exponent" connected to the D inputs of register 520, 12 leads representing data bits (00–11) via line X as address inputs to both PROM tables, and 12 leads representing data bits (12–23) via line Y to the multiplier 514.

PROM table 1 has 4K words of 24 bits each, and the 24 output leads from device 510 are coupled via registers 530 & 532 in tandem to the A inputs of the arithmetic logic unit 516. PROM table 2 has 4K words of 12 bits each, and the 12 output leads from device 512 are connected to inputs of the multiplier 514. The multiplier 514 has 13 output leads connected to the B inputs of the ALU 516. The ALU has 24 outputs and a clock lead connected to an output register 518. The output to line 11A comprises 8 leads for "exponent out" from register 524 and 24 leads for data from register 518. The 32 output leads, along with a lead from device 578 and a lead from device 542, are also connected as inputs to the parity generator 560.

The clock signals are supplied via NAND gates 550, 552, 554 & 556. An inverter with its input at ground potential supplies pull-up potential to gates 550, 554 & 556. The clock input is to gate 550, whose output is connected to gates 552, 554 & 556. The outputs of gates 554 & 556 provide clock signals to registers 520, 522, 530, 532, 542 & 544, and to the multiplier 514. A "load output register" signal on lead 12 is used to enable a clock signal via gate 552 to register 524 and to the ALU 516.

The logic 540 has three inputs, "clear output", "preset output" and "-add/subtract". It has one output coupled via a flip-flop of register 542 to an output lead "clear exponent out", and three output leads coupled via registers 542 and 544 in tandem to provide ALU control signals to unit 516.

The test bus controls signals on line 15 comprise "-receive/transmit" which is coupled via an OR gate 570 to control the transceiver unit 574 for transferring data out to the test bus 14, and signals "disable test bus 1" and "disable test bus 2" which are coupled via an OR gate 572 to control the transceiver unit 574 for transferring data in from the test bus 14. The output of gate 570 is also coupled via an OR gate 576 and an inverter 578 to an output lead "exponent disable out".

The input data setup time for the transform board shown in FIG. 5 is 77 ns (nanoseconds) for in data, 77 ns for test bus, 10 ns for clear output, 20 ns for add/subtract, 17 ns for in exponent, 50 ns for clear exponent, and 10 ns for preset output.

II-B. Log Sum or Difference

The function of the Log sum or difference is to execute the following calculations:

$$A^n \cdot B^m$$

$$A^n / B^m$$

$$B^n / A^m$$

where A and B are 32 bit numbers in the log domain and N and M can be 0, $\frac{1}{2}$, $\frac{1}{4}$, 1, 2.

Figure 6:
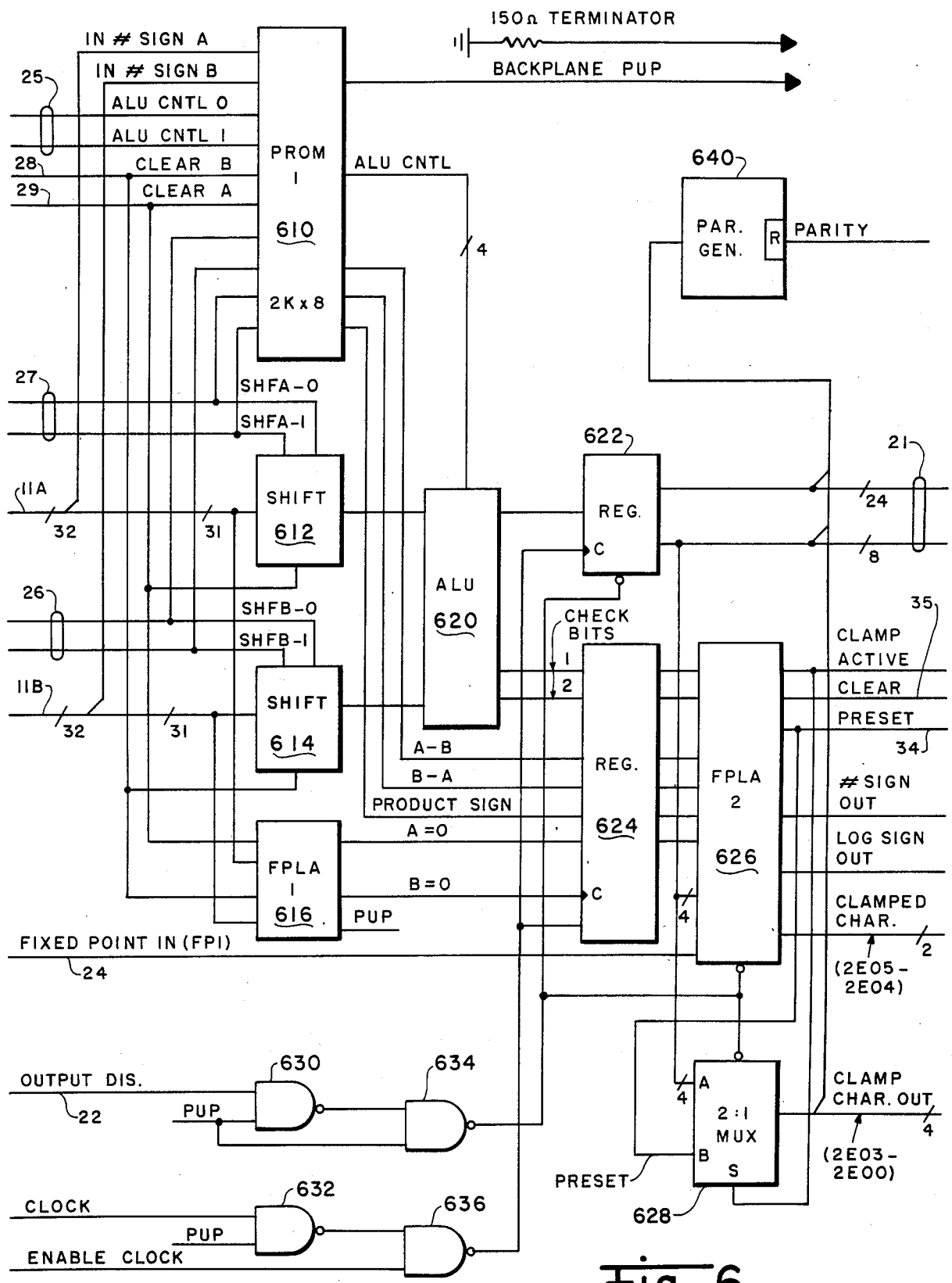
FIG. 6 is a block diagram at the IC level for the log sum or difference board of FIG. 1.

Referring to the functional block diagram in FIG. 6, the log sum or difference board contains two four-way shifters 612 and 614, an ALU 620, and over/underflow logic. The board has two 32-bit input ports 11A and 11B and one 32-bit output port 21. The over/underflow logic detects underflow or overflow conditions resulting from a log operation and controls the over/underflow clamp hardware on the antilog board accordingly.

The two four-way shifters, one on each input, will square, square root, or take the fourth root of incoming data. The shifters work independently of each other. The output of each shifter go to the ALU 620 that adds or subtracts the two numbers. This performs a multiply or a divide. The ALU is able to perform a A+B, B−A, A−B, or clear output. The four bit shifters will shift the input data +1, 0, −1 or −2 bits. This will square, pass data, square root or take the fourth root of the data respectively, if the data is in the log domain.

Over/Underflow Clamp

Figure 6A:
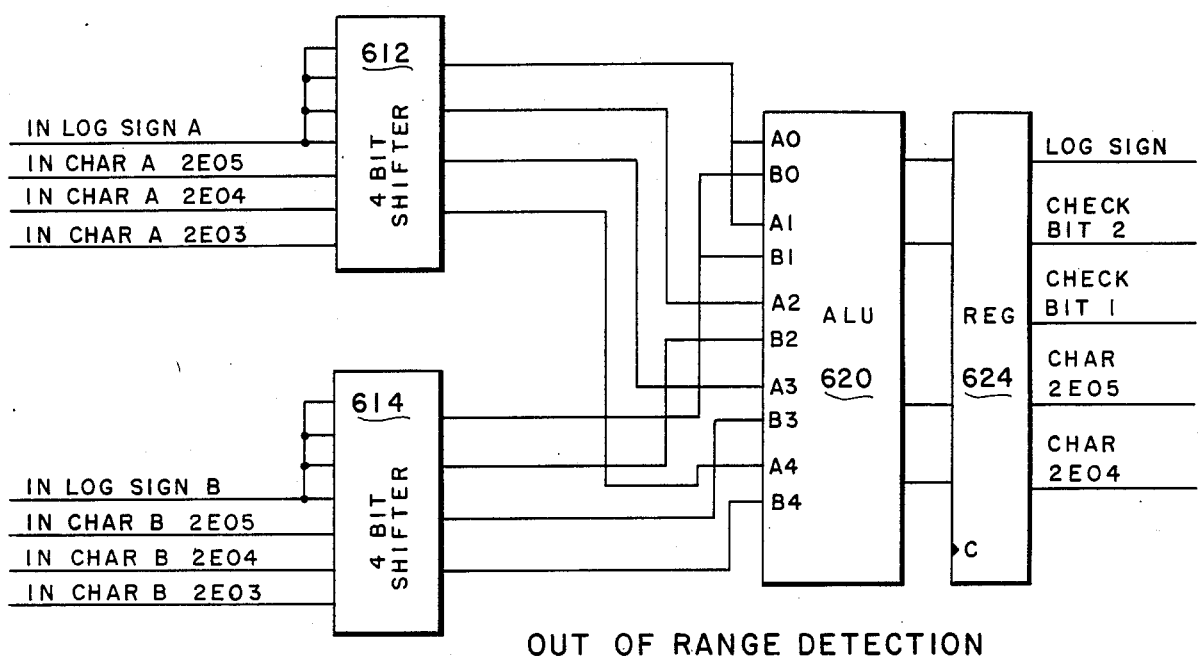
FIGS. 6A and 6B are functional block diagrams showing the out-of-range and special case detection schemes in FIG. 6.

The over/underflow clamp function clamps a number that is out of the pipeline's 32-bit number range after a log operation. An overflow (number greater than $3FFFFFFF_{16}$) will be clamped to $3FFFFFFF_{16}$ if it is positive or $BFFFFFFF_{16}$ if it is negative. An underflow (number less than $41000000_{16}$) will be clamped to $41000000_{16}$ if it is positive or negative. Logic will exist for special cases as follows:

1. Divide by zero = $3FFFFFFF_{16}$ or $BFFFFFFF_{16}$
2. Zero divided by zero = $41000000_{16}$
3. Zero divided by a nonzero number = $41000000_{16}$
4. Multiply by zero = $41000000_{16}$
5. Exponent = $40_{16}$ = $41000000_{16}$ Numbers that are out of range as a result of a multiply, divide or square (a square root or fourth root can never be out of range) will be implemented as shown in FIG. 6A.

Figure 6B:
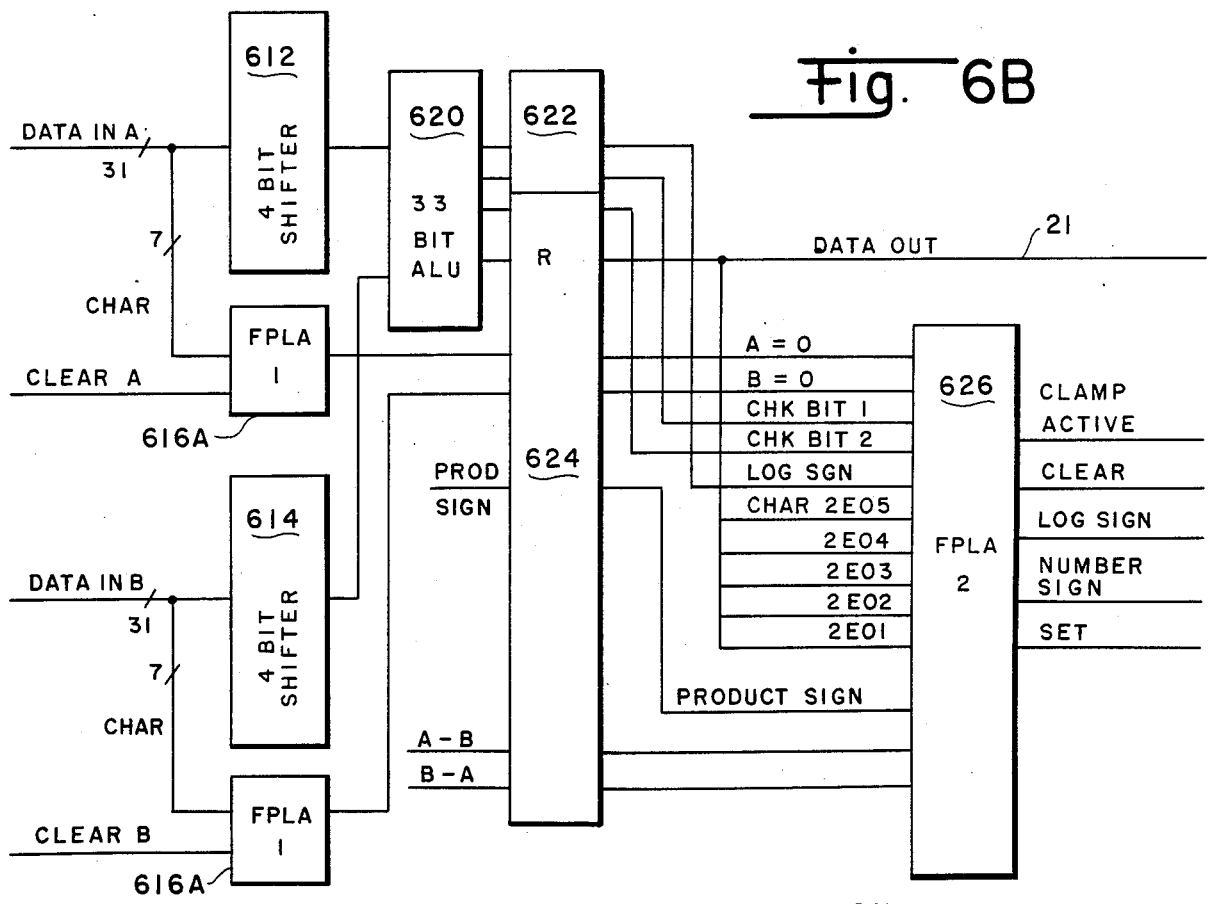

The concept behind this implementation is as follows: If the log sign is low, and check bit one or check bit two is high, then an overflow condition has occurred. If the log sign is high and check bit 1 or check bit 2 is low, then an underflow condition has occurred. FIG. 6B shows the implementation logic that will take care of the special cases mentioned previously. FPLA 1 (device 616 comprises portions 616A & 616B) detects a characteristic of $40_{16}$ or $41_{16}$ on the A or B inputs. A $40_{16}$ is an illegal characteristic. A characteristic of $41_{16}$, or an exponent of $41_{16}$ will be defined as zero. Any implied one floating point number with an exponent of $41_{16}$ will be treated as a zero (instead of $2^{-63}$). The CLEAR A and CLEAR B will also be input to FPLA 1. This is needed to determine if the A or B side is cleared. A−B and B−A signals from Prom 1 (device 610) are needed to determine if an A·B, B/A, or reset operation is to be done. The A=0 or B=0 lines output from FPLA 1 will tell FPLA 2 of a special case. FPLA 2 looks at the characteristic after the output register. If the characteristic is $40_{16}$ or $41_{16}$, the underflow clamp will be activated. FPLA 2 also uses the two check bits from the ALU to determine an out of range number. FPLA 2 will combine the outputs of FPLA 1, Prom 1, and the ALU to control the over/underflow clamp located on the Antilog Transform Board (FIG. 5 with reference characteristics in parentheses for input and output lines).

The device 610 is a 2K×8 PROM IC type Intel 26. The two shifters are each a special gate design using an IC type TI TAT 1022. The ALU 620 comprises nine ICs type 74F381 (4-bit arithmetic logic units) and three IC chips type 74F182 (Carry lookahead generator). The registers 622 and 624 using Octal D Latch IC chips, which comprise positive edge-triggered flip-flops. Register 622 comprises four ICs and register 624 one IC. The Field Programmable Logic Arrays 616 and 626 are IC type FPLA. The multiplex device 628 is and IC type 74S257. A parity generator 560 comprises three chips of IC type 93S48.

The clock signals are supplied via NAND gates 630, 632, 634 & 636. Pull-up potential is supplied to gates 630 & 632. The clock input is to gate 632, whost output is connected to gates 636, which has another input ENABLE CLOCK. The output of gates 636 provides clock signals to registers 622 & 624. Gates 630 & 634 repeat the signal OUTPUT DIS from lead 22 to register 622, FPLA device 626 and multiplex device 628.

The input data setup time for the board shown in FIG. 6 is 90 ns (nanoseconds) from the PROM inputs to device 610, 95 ns for the shifter inputs to devices 612 & 614, 90 ns for the data inputs 11A & 11B, and 75 ns for clamp outputs valid.

III. FLOATING POINT ALU

The floating point ALU section of the Arithmetic Pipeline (comprising the floating-to-fixed point board 4, the 36-bit ALU board 5, and the fixed-to-floating point board 6 shown in FIG. 1) has the following capabilities: addition, subtraction, absolute value, negative absolute value. It has logical functions as follows: and, or, exclusive or, reset, preset. It is able to shift a fixed point number, right or left, 0 to 32 positions. The user will be able to input and output data in: floating or fixed ponit, signed or unsigned, two's complement or magnitude (refer to section Arithmetic Pipeline Controls under Data types). There is one 32-bit input port 31 and one 32-bit output port 41 which will operate at a rate not greater than one 32-bit word per 120 ns. A maximum of 128 floating point terms can be accumulated without the ALU overflowing. A maximum of 8 fixed point terms can be accumulated without the ALU overflowing. The subfunctions of the floating point ALU are: floating to fixed point, 36 bit ALU, fixed to floating point, and over/underflow clamp.

III-A. Floating to Fixed Point

The Floating to Fixed Point function is used to convert a floating point number to a fixed point number. Its main function is to align the binary points of floating point data, so that they can be added or subtracted, etc. The shifter will shift a 32-bit number 0 to 32 bit positions, left or right. The number can be in 2's complement, magnitude, or signed magnitude notation. The Floating to Fixed Point function consists of: exponent select logic and shifter logic. The exponent logic substracts the incoming exponent from the largest previous exponent encountered. If the difference is negative, the incoming exponent becomes the largest exponent. A FX PT REF (fixed point reference) can take the place of the largest exponent. This allows the user to convert a floating point number to a fixed point with the binary position determined by the FX PT REF.

Floating to Fixed Point Board

Figure 7A:
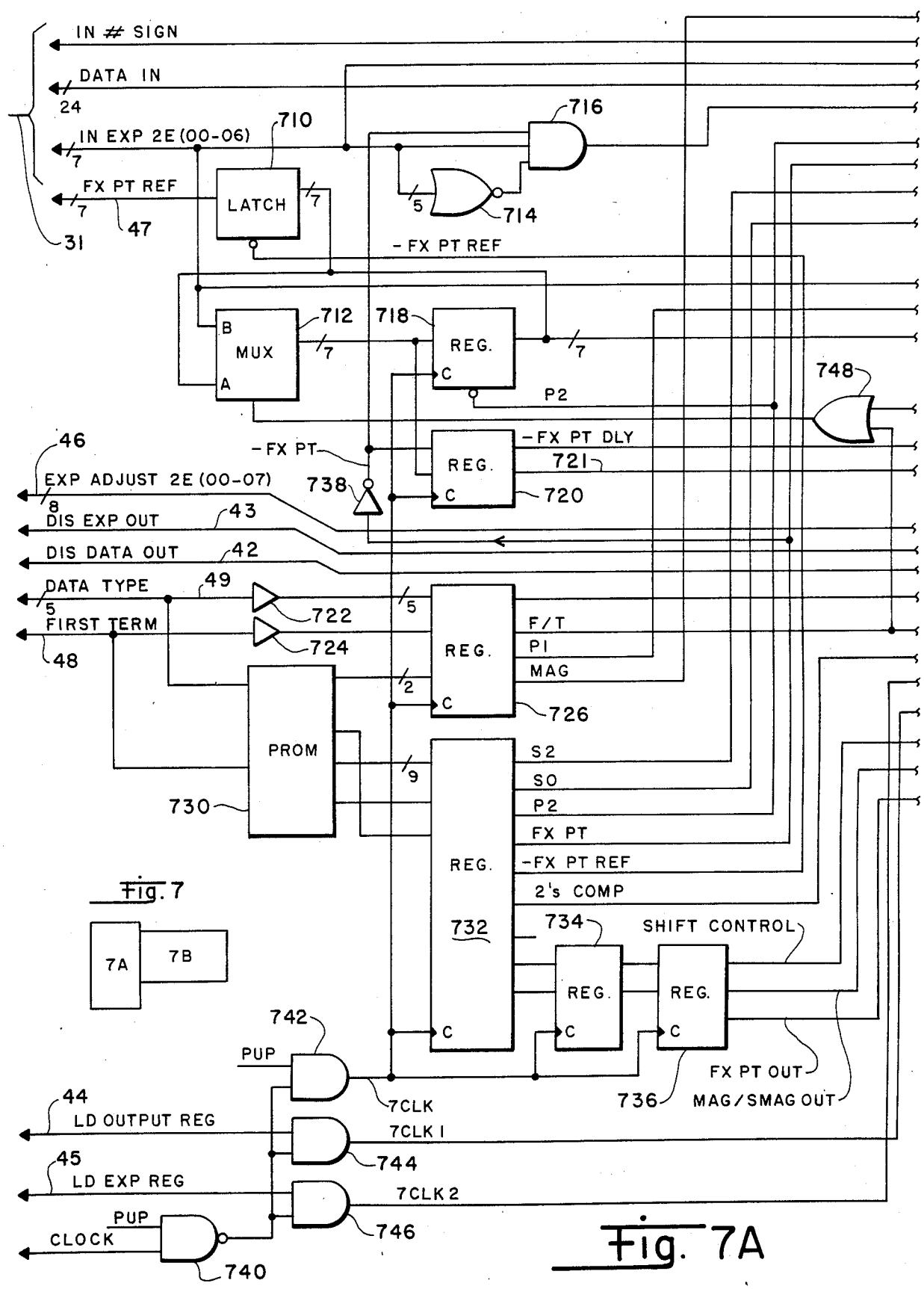

FIGS. 7A and 7B (arranged as shown in FIG. 7) comprise a functional block diagram of the Floating to Fixed Point Board. The input line 31 comprises one lead for IN # SIGN, 24 leads for DATA IN, and seven leads for IN EXP 2E (00–06). The 24 DATA IN leads are shown across the top of FIG. 7A to the input I of a shifter 780 (IC type SHIFTER TAT 1022 gate array) in FIG. 7B. An additional eight leads from a multiplex device 764 (two ICs type 74F157 quad 2-input multiplexers) are also connected to the input of shifter 780. The lead IN # SIGN and a lead MAG are connected as inputs to an AND gate 756, whose output is the A input of the multiplexer 764 (eitht A inputs are connected in parallel to one lead from gate 756) The seven leads of line IN EXP 2E (00–06) are connected to the B input of the multiplexer 764. The multiplexer 764 has one control input from an AND gate 762, and another on lead FX PT from register 732. One of the inputs of gate 762 is via an inverter 758 from the output of gate 756, and the other is a lead -IMPLIED ONE from a three-input AND gate 716. One of the inputs of gate 716 is via an inverter 738 from lead FX PT, and another is from the output of a Shottky NOR gate 714 (IC type 74S260). One of the leads of line IN EXP2E is connected as the third input of gate 716, and five of the leads are connected as inputs to gate 714.

The 32 leads from the output O of shifter 780 go to a register 790. (The registers are comprised of IC devices type 74F374, register 790 being four devices; registers 718, 720, 726, and 754 each one device; and registers 734 & 736 together one device. The 32 leads from register 790 go to the output line 41 (DATA OUT 2E (00–31), and also to a parity generator 794 (4 ICs type 93S48). A board input lead 42 (DIS DATA OUT), repeated via a gate 792, goes to the reset input of register 790.

The shifter 780 has six control inputs with functions as follows:

| INPUT | FUNCTION |
|-------|----------|
| FILL | Use to fill in bit positions that have been shifted out. |
| -R/L | Shift right or shift left |
| S | Shift code - indicates how many places to shift |
| OD | Output disable - places outputs in high impedance state |
| SET | When high sets all 32 bits to ones. |
| CL | When high sets all 32 bits to zeros. |

Input FILL is supplied from an AND gate 782, which has one input on line 2's COMP from register 732, another input on lead IN # SIGN of line 31, A signal on lead SGN form ALU 750 is inverted in device 768 to lead -R/L, which is connected to an input S1 of an ALU 772, to a third input of gate 782, and to the input -R/L of the shifter. The input S for the shifter is on a 5-lead line SC 2E (00-04) from the ALU 772 (two chips). A NOR gate (IC type 74S260) generates a signal on line ZERO, which is inverted via a gate 788 to the clear input CL of the shifter. The lead ZERO is also coupled via an AND gate 786 to a board output lead # SIGN OUT. Another input of gate 786 is lead IN # SIGN. The gate 784 has two inputs grounded, two inputs on lead SC 2E 05 and lead CHECK 1 are from the ALU 772, and one input is lead -IMPLIED ONE.

The seven leads of input line 47 (FX PT REF) are connected to a latch device 710 (Octal transparent D-type latch IC type 74F373). The seven leads IN EXP 2E (00-06) of the input line 31, in addition to the connections mentioned above, are also connected to the B input of a multiplex unit 712 (IC type 74F157, quad two-input multiplexer) and to the B input of ALU 750. The multiplexer 712 has seven output leads connected to inputs of both of registers 718 and 720. The seven output leads are connected respectively to the seven leads from the latch unit 710, and these seven leads are connected both to A inputs of the multiplexer 712, and to A inputs of ALU 750. Register 720 also has an input from lead -FX PT. The register 720 also has outputs to line 721 (seven leads), which is connected to inputs B of the ALU 752.

There are four arithmetic logic units 750, 752, 772 and 774 (ALUs 750 & 752 are each two ICs type 74F181, and ALUs 772 & 774 are each two ICs type 74F382). The A & B inputs of ALU 750 are mentioned above. The C inputs are to lead P1 from register 726. An M input is grounded, S0, S2 and S3 inputs are connected respectively to S0, S2 and FX PT output leads from register 732, and S1 input has a pullup potential. Eight output leads (SGN and seven others) form line ALU OUT to B inputs of ALU 772 and A inputs of ALU 774. The lead SGN also goes to the C inputs of both ALUs 772 and 774, to inverter 768, to gate 748, and to a gate 770. The ALU 752 has its A inputs connected to eight leads of board input line 46 (EXPONENT ADJUST 2E (00-07), and the C input to a pullup potential. The M, S1 and S3 inputs of ALU 752 are grounded, and the inputs S0 and S1 inputs are to lead -FX PT DLY from register 720. Eight output leads from ALU 752 go to inputs of register 754; whose outputs are eight leads of board output line 66 (EXP OUT 2E (00-07), which also go the parity generator. Board input lead 43 (DIS EXP OUT) goes to the reset input of register 754.

The arithmetic logic units 772 and 774 have inputs from the ALU 750 as described above. The S0 input of ALU 772 is from an OR gate 766, which has one input from lead -R/L, and another input on lead P2 from register 732. The S1 input of ALU 772 is from lead -R/L, and the S2 input is grounded. The ALU 774 has the S1 input grounded, and the S0 and S2 inputs from an AND gate 770, having one input from lead SGN. The ALU 772 has output leads SC 2E (00-04), SC 2E 05 and CHECK 1, which provide provide inputs to the shifter 780 as described above. The outputs of ALU 774 include five leads comprising board output line 67 (SHIFT CODE 2E (00-04), which also go to the parity generator. Two outputs of ALU 776 are inputs of an OR gate 776, whose output is a board output SC OUT OF RANGE. An OR gate 778 has one input from gate 776, and another input on lead F/T from register 726. The output of gate 778 is the board output 58 (CLEAR ACCUMULATOR)

Five leads of board input line 49 (DATA TYPE), and board input lead 48 (FIRST TERM), are repeated via buffers 722 & 724 (IC type 74LS244) to inputs of register 754. The outputs of the five "data-type" latches of register 374 go to board output line 57 (DATA TYPE OUT), and the output of the latch having the "first-term" goes to lead F/T. Input lines 49 and 48 also go to inputs of a PROM 730 (three ICs type 93427). Two of the outputs of PROM 730 go to latches of register 726, whose outputs are to leads P1 and MAG. Eleven of the outputs of PROM 730 go to register 732, which has outputs on leads S2, S0, P2, FX PT, -FX PT REF, and 2's COMP. One output of register 732 is unused, and three outputs are repeated via registers 734 and 736 in tandem to leads SHIFT CONTROL, MAG/SWAG OUT, and FX PT OUT.

The clock input to the board goes to a NAND gate 740 having a pullup potential for the other input, and an output to NAND gates 742, 744 & 746. Gate 742 has a pullup potential for its other input, and its output repeats the clock signal to registers 718, 720, 726, 732, 734 and 736. Gate 744 has an input on input line 44 (LD OUTPUT REG), and an output on line 7CLK 1 to provide a clock signal to register 790. Gate 746 has an input on input line 45 (LD EXP REG), and an output on line 7CLK 2 to provide a clock signal to register 754.

The input setup time for the board shown in FIGS. 7A & 7B is 20 ns (nanoseconds) for NUMBER SIGN IN, 100 ns for EXPONENT IN, 100 ns for FX PT REF, 25 ns for IN DATA, 50 ns for FIRST TERM, and 50 ns for DATA TYPE.

Exponent Select

The Exponent Select Logic (partly included in the ALUs 750 and 774) generates shift code 1 which controls the shifter on the 36-bit ALU board 5, via line 67. The Exponent Select will also select the largest exponent out of a possible 128 terms, and generate an implied one bit.

Shift Code Determination

Shift Code 1 and 2 are generated by subtracting each exponent from the largest exponent encountered. If the output of the subtraction is negative, the largest exponent is replaced by the exponent from which the largest exponent was subtracted. If the input is in floating point and the shift code is positive, the 32-bit shifter is not shifted, regardless of shift code 1. Shift code 2 is used to shift the shifter on the 36 bit ALU board. If the input is in fixed point, the largest exponent is replaced with the fixed point reference. The 32 bit shifter 780 is shifted regardless of sign. The shifter on the ALU board is not shifted.

The fixed point reference can be used to convert a floating point number to fixed point number with the binary point position defined by the fixed point reference.

FX PT REF = No. of non-fractional bits − 8

If the input is in fixed point, the fixed point reference is used to control the shifter directly.

Exponent Determination

The exponent will be the largest exponent encountered in an accumulation of 1 to 128 terms. The Exponent Adjust is then added to the exponent to compensate for seven overflow bits in the 36-bit ALU.

For floating-to-floating-point calculation, the exponent adjust is equal to seven. For fixed-to-floating-point conversions, the exponent adjust is used to tell the fix to float board the position of the binary point of the data out of the 36 bit ALU. The following equation can be used to calculate the Exponent Adjust.

Exp Adj = No. non-fractional bits − 1

Implied One Determination

When converting a floating point number to fixed point, the implied one bit will be inserted back into the number. If the exponent is $40_{16}$ (01000000) or $41_{16}$ (01000001), the implied one bit will be low. This will assure that a zero plus zero in floating point is zero. If fixed point data is to be input, the implied one bit becomes a data bit.

32-Bit Shifter

The 32-bit shifter 780 has the capability of shifting data left a maximum of 32 bit positions or right a maximum of 32 bit positions. The shifter is controlled by shift code 1. A negative shift code represents a shift to the left, and a positive shift code represents a shift to the right. The shifter has the capability of detecting a shift code that is out of the shifter's shifting range and reset the output. When the input to the shifter is a floating point number, the shifter will disregard a positive shift code and not shift at all.

Shifter Operation

The shifter uses a gate array to shift a number from 0 to 32 bit positions. The shifter is able to accept floating point, two's complement, signed magnitude and magnitude data. In the case of a number in two's complement, if it is negative and the number is shifted to the right, all leading zeros at the output must be made high. For signed magnitude and two's complement input, the MSB is the sign bit. This bit will be zeroed out and the entire input will be shifted up one position automatically. This is so that magnitude, floating point, signed magnitude, and two's complement data may use the same input.

III-B. 36-Bit ALU

The ALU Function has the capability of addition, subtraction, oring, anding, exclusive or, absolute value of the input, and negative absolute value of the input. The ALU will accept magnitude, signed magnitude, or two's complement data. The output will be in either signed magnitude or two's complement. Logical functions are: AND input and accumulator, OR input and accumulator, EXCLUSIVE OR input and accumulator, and NOT input PLUS accumulator.

36-Bit ALU Board

Figure 8:
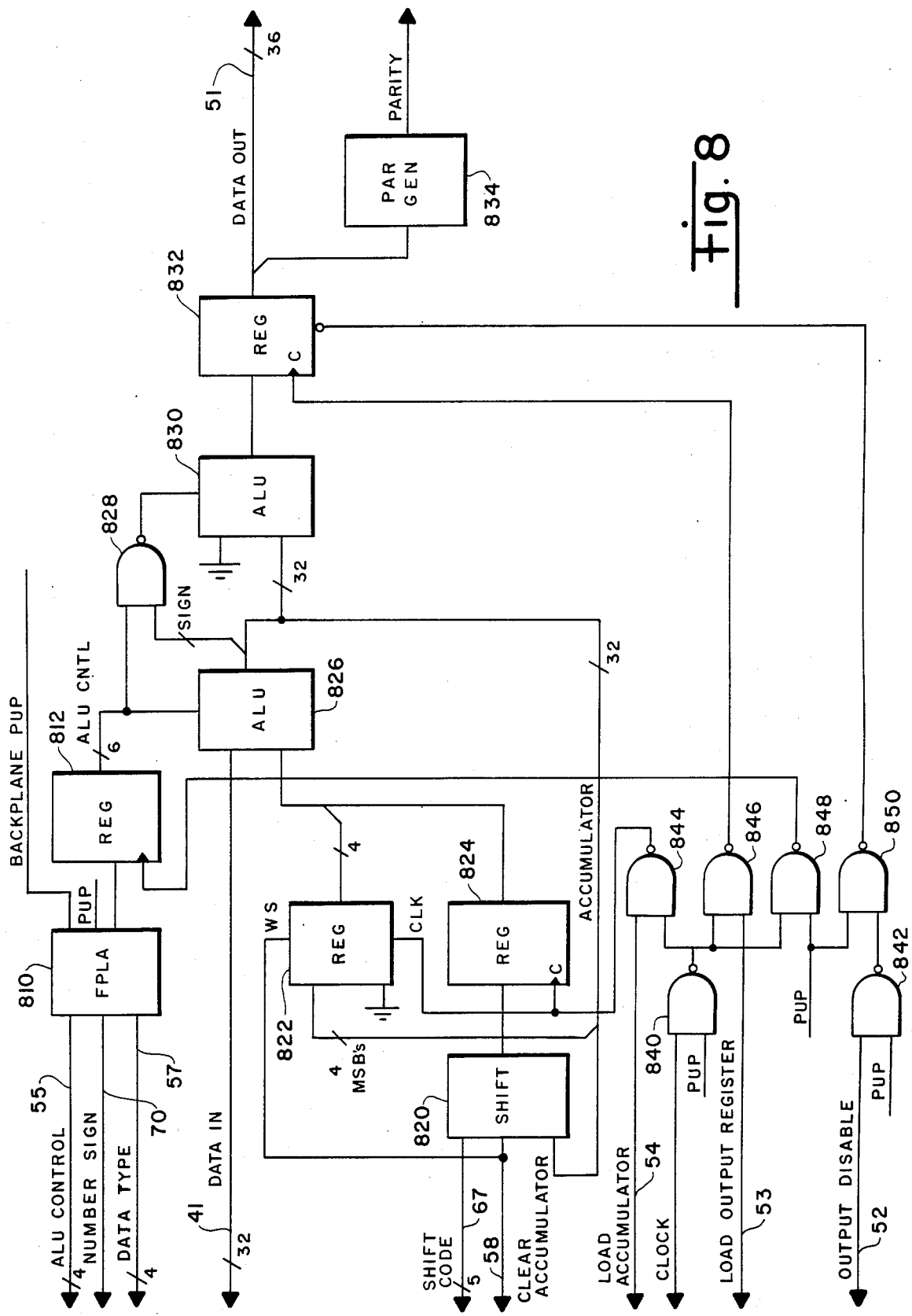
FIG. 8 is a block diagram at the IC level for the 36-bit ALU board of FIG. 1.

FIG. 8 is a chip level diagram of the ALU Board. The 32-lead input line 41 is connected as the input of arithmetic logic unit 826. The input lines 55 (4 leads ALU CONTROL), 70 (NUMBER SIGN), and 57 (4 leads DATA TYPE) are connected as inputs to a field programmable logic unit 810 (IC type FPLA). The input lines 67 (5 leads SHIFT CODE) and 58 (CLEAR ACCUMULATOR) are connected as inputs to a shifter 820 (IC type SHIFTER). The lead 58 is also connected as a control input (WS) to register 822.

The output of the FPLA 810 is coupled via a register 812 to a 6-lead line ALU CNTL. (The registers are comprised of IC devices type 74F374, register 812 being one device; register 832 five devices; and register 824 four devices. Register 822 is an IC device 74LS399) The six leads of line ALU CNTL are connected as inputs to the ALU 826, and one of the leads is connected as an input to a NAND gate 828. The other input of gate 828 is one lead SIGN from the ALU 826, and the output is an input to the ALU 830. (The ALUs 826 & 830 each comprise 12 ICs type 74F381) The output of ALU 826 comprses 32 leads connected to the input of ALU 830, and also to the input of the shifter 820. The four leads with the most significant bits are also connected via a register 822 back to an input of ALU 816. The output of ALU 830 comprises 36 leads coupled via register 832 to the output line 51 (DATA OUT). The output of register 832 is also connected to a parity generator 834 (IC type 93S48).

The output of shifter 820 is coupled via a register 824, along with the four leads from the output of register 822, to inputs of the ALU 826.

The input clock is coupled via a NAND gate 840 to four NAND gates 844, 846, 848 and 850. The input lead 54 (LOAD ACCUMULATOR) is another input of gate 844, whose output supplies the clock signal for registers 822 and 824. The input lead 53 (LOAD OUTPUT REGISTER) is another input of gate 846, whose output supplies the clock signal for register 832. The input lead 52 (OUTPUT DISABLE), via NAND gate 842, provides another input of gate 850, whose output supplies a reset signal for register 832. The gates 840, 842, 848 and 850 also have inputs with pullup potential.

The input setup time for the board shown in FIG. 8 is 55 ns (nanoseconds) for DATA TYPE, 100 ns for DATA IN, 60 ns for SHIFT CODE, 45 ns for CLEAR ACCUMULATOR, 5 ns for LOAD ACCUMULATOR, 5 ns for LOAD OUTPUT REGISTER, 55 ns for ALU CONTROL, and 55 ns for NUMBER SIGN.

ALU Operation

The ALU board contains an ALU 826 for arithmetic and logical operations and an ALU 830 to convert two's complement data into signed magnitude. A 32-bit two's complement shifter will shift the output of the first ALU anywhere from 0 to 32 bit positions. This shifter is used if the incoming exponent is greater than the largest exponent encountered. The output of the shifter goes to a 32-bit accumulator register. The register can be cleared or loaded by using the clear ACC and load ACC signals.

III-C. FIXED TO FLOATING POINT

The function of the Fixed to Floating Point is to convert a 32-bit fixed point signed magnitude number, along with an eight-bit two's complement exponent input, to a 32-bit implied one floating number. It is also able to output the 32-bit fixed point input in signed magnitude, magnitude, or if the input is in two's complement, two's complement notation. If the input data and/or exponent is out of range, the over/underflow clamp will be activated. The Fixed to Floating Point function consists of four parts: a shift code generator, shifter, exponent logic, and an over/underflow clamp.

Figure 9A:
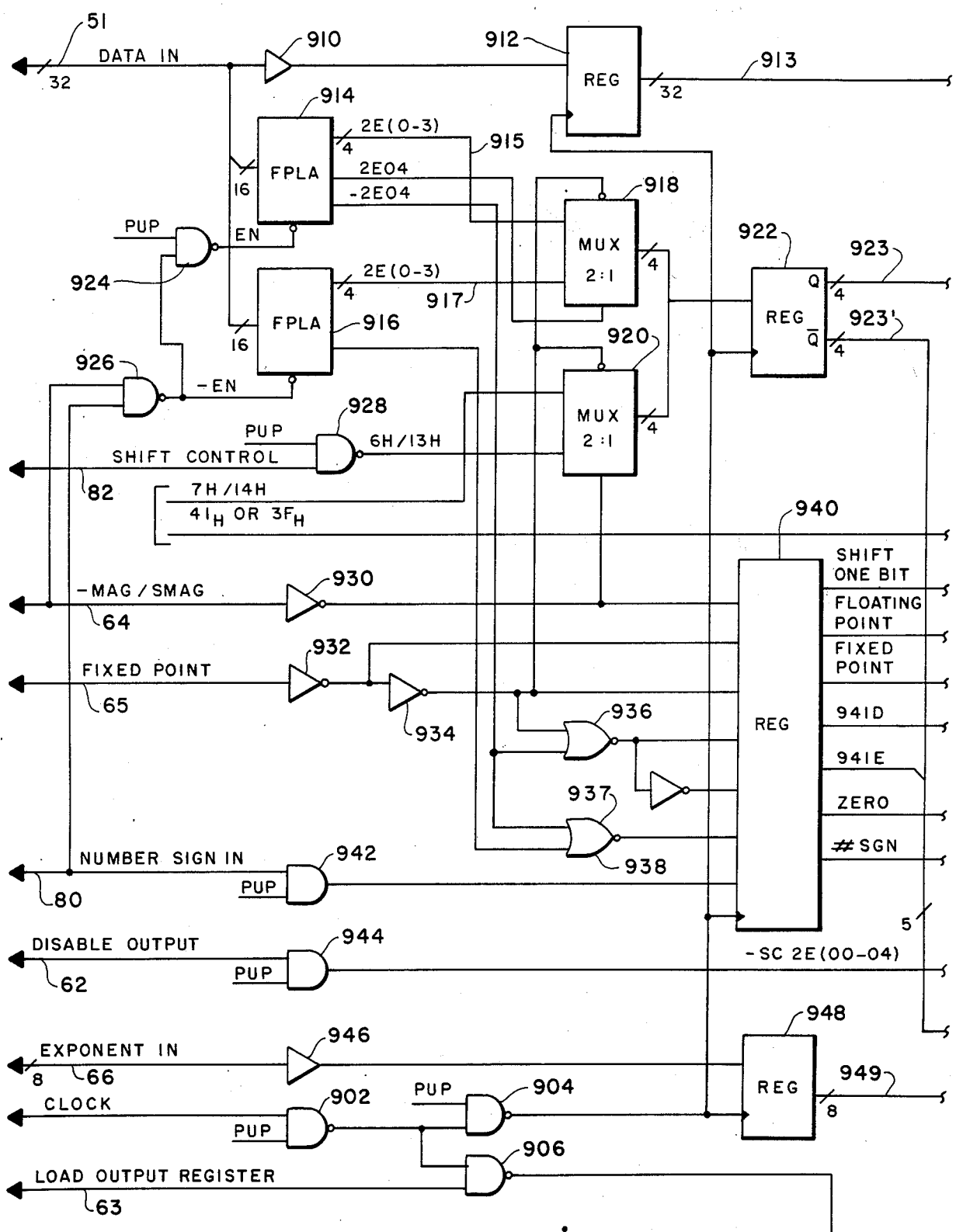
FIGS. 9A and 9B when arranged as shown in FIG. 9C comprise a block diagram at the IC level for the fixed-to-floating-point board of FIG. 1.
Figure 9B:
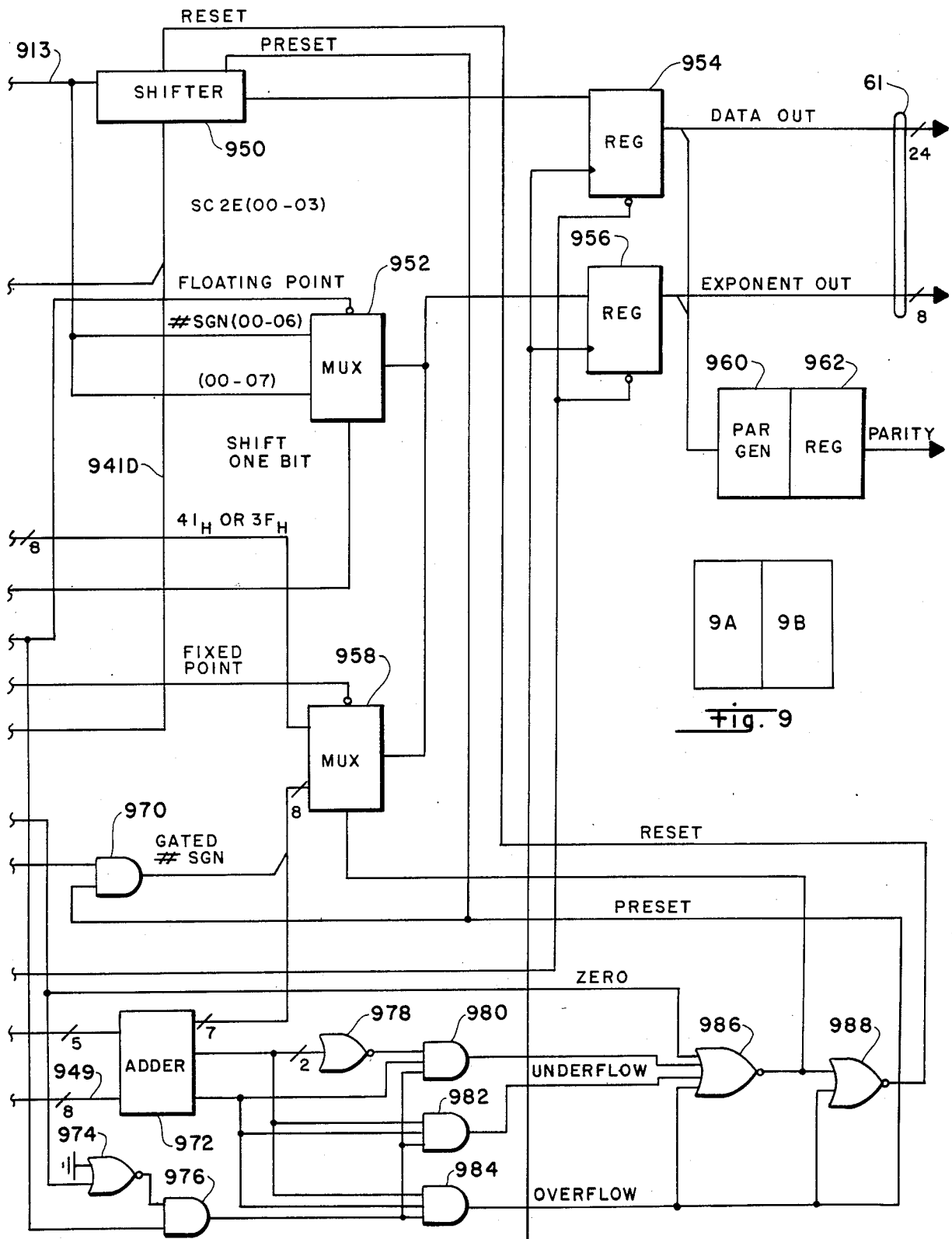

FIGS. 9A & 9B, arranged as shown in FIG. 9, comprise a functional block diagram of the Fixed to Floating Point Board. The 32 leads of the DATA IN line 51 are coupled through buffers 910 (four ICs type 74LS244), and a register 912 (four ICs type 74LS374) to the shifter 950. (The other registers are comprised of IC devices type 74F374, registers 954 & 962 being each three devices; and registers 940, 948 and 956 each one device). The output of the shifter 950 is coupled through a register 954 to 24 leads of the DATA OUT line 61.

The DATA IN line 51 is also connected to the inputs of two field programmable logic arrays 914 and 916 (each two ICs type FPLA), with 16 leads to each. These devices have enable inputs from a NAND gate 926, which has inputs from the input lines 64 and 80 (-MAG/SMAG and NUMBER SIGN IN). The output of gate 926 on lead EN goes to the FPLA 916, and is inverted via gate 924 to lead EN and the FPLA 914.

There are two 4-bit 2:1 multiplexers 918 and 920 (each an IC type 74S257), having their respective output leads connected together to the four-bit input of a register 922 (IC type 74S175). The multiplexer 918 its two 4-bit inputs on lines 915 and 917 from outputs of the FLPA devices 914 and 916 respectively, each designated 2E(0-3). From FPLA 918, an output lead 2E04 is the select control input of multiplexer 918, and an output of lead-2E04 goes to inputs of two NOR gates 936 and 938. The FPLA 916 has an output lead connected to another input of gate 938. The multiplexer 920 has its two 4-bit inputs connected respectively to lines 7H/14H and 6H/13H. The signal on line 6H/13H is from the SHIFT CONTROL input on lead 82, inverted via gate 928. The select control input of multiplexer 920 is from the -MAG/SMAG input lead 64, via an inverter 930. Enable inputs for both multiplexers are connected to the same lead from the FIXED POINT lead 65, via two inverters 932 and 934.

A register 940 uses seven latches. The first has its input from the -MAG/SMAG line 64 via an inverter 930, and its output to a lead SHIFT ONE BIT. The second has its input from the FIXED POINT line 65 via an inverter 932, and its output to a lead FLOATING POINT. The third has its input from the FIXED POINT line 65 via two inverters 932 and 934, and its output to a lead FIXED POINT. The fourth has its input from the output of gate 936, and its output to a lead 941D. The fifth has its input from the output of gate 936 via an inverter 937, and its output to a lead 941E. The sixth has its input from the output of gate 936 via an inverter 937, and its output to a lead 941E. The sixth has its input from the output of gate 938, and its output to a lead ZERO. The seventh has its input from the NUMBER SIGN IN line 80 via a buffer gate 942, and its output to a lead # SGN.

In FIG. 9B, there are two 8-bit 2:1 multiplexers 952 and 958 (each two ICs type 74S257), having their respective output leads connected together to the eight-bit input of a register 956. The multiplexer 952 its two 8-bit inputs connected to output leads of line 913 from the register 912, the first for bits # SGN, (00-06) and second for bits (00-07). The multiplexer 958 one 8-bit input connected to line $41_H$ OR $3F_H$, and its other 8-bit input connected to seven leads from an adder 972 and one lead to the output of a gate 970.

From register 940, the SHIFT ONE BIT output goes to the select control input of the multiplexer 952. The FLOATING POINT output goes to the enable input of multiplexer 952. The FIXED POINT output goes to the enable input of multiplexer 958. The output on lead 941D goes to control inputs of the shifter, along with four leads 923 from the Q outputs of register 922. The output on lead 941E goes to the adder 972, along with four leads 923′ from the not Q outputs of register 922, to form a 5-bit input to the adder. The ZERO output goes to an input of a NOR gate 986, and also to an input of gate 974 used as an inverter. The # SGN output goes to an AND gate 970, which provides a GATED # SGN bit to the multiplexer 958.

The eight leads of the EXPONENT IN line 66 are coupled through buffers 946 (IC type 74LS244), and a register 948 to an input of the adder 972 (IC type 74S283). In addition to the seven output leads to the multiplexer 958, the adder 972 has output leads connected as inputs of a NOR gate 978 (IC type 74S260), one of the latter leads also being connected as an input to each of gates 982 and 984. Another output lead from the adder 972 is connected as an input to each of gate 980, 982 and 984. The gate 980 also has an input from gate 978. The output of AND gate 976 is connected to an input of each of the gates 980, 982 and 984. One input of gate 976 is ZERO inverted, and the other input is FLOATING POINT from register 940. The outputs of gates 980 and 982 form UNDERFLOW. The output of gate 984 is OVERFLOW, which is used as a PRESET signal to the shifter 950, and also as an input of gate 970. A NOR gate 986 (IC type 74S260) has input from the outputs of gates 980, 982 and 984, and lead ZERO. Its output is used for the select control input of multiplexer 958, and also as an input to a NOR gate 988. The other input of gate 988 is from gate 984 (OVERFLOW), and its output is RESET to the shifter 950.

Shift Code Generator

The shift code generator is a 32-bit priority encoder. The 32-bit encoder will look at the input data and output a binary number that will indicate the first most significant bit position that is high if the output is in floating point or low if the output is in floating point two's complement. This output is called the shift code. The shift code tells the 32-bit shifter how many bits to shift to the left. The shift code is also used to adjust the exponent to compensate for the shift. If the data input is all zeros, the underflow clamp wil be activated. Note that the shift code for a number to be converted to sign magnitude is always $6_{16}$, and a magnitude number, a $7_{16}$. This will place the 32-bit number at the right position on the output bus.

Shifter

The shifter is able to shift up to 32 bit positions to the left. The shifter is used to shift the input to the left so that leading zeros and the first most significant high, if floating point or low if floating point two's complement, bit do not show up in the output. This procedure will convert the input into implied one floating point notation. The shifter is also be used to shift the input 6 bits to the left for signed magnitude outputs or 7 bits to the left for magnitude outputs. This shift places the input data at the right bit position on the output bus.

The input setup time for the board shown in FIGS. 9A & 9B is 56 ns (nanoseconds) for DATA IN, 30 ns for -MAG/SMAG, 20 ns for FIXED POINT, 36 ns for EXPONENT IN, and 20 ns for SHIFT CNTL.

Over/Underflow Clamp

Exponent Logic

The exponent logic will subtract the shift code from the exponent to form an adjusted exponent. In this way, as the leading zeros are removed from the data, the exponent will be adjusted accordingly. If the output of the subtraction is greater than $3F_{16}$ or less than $41_{16}$, the over/underflow clamp will be activated.

The Over/Underflow Clamp (bottom of FIG. 9B) will detect an adjusted exponent greater than $3F_{16}$ and clamp the output to $3FFFFFFF_{16}$ if the sign is positive or $BFFFFFFF_{16}$ if the sign is negative. If the adjusted exponent is less than or equal to $41_{16}$, it will clamp the output to $41000000_{16}$, regardless of the number sign. The over/underflow clamp will be disabled for outputs in fixed point notation.

FLOATING POINT ACCULULATOR ARCHITECTURE

Figure 10:
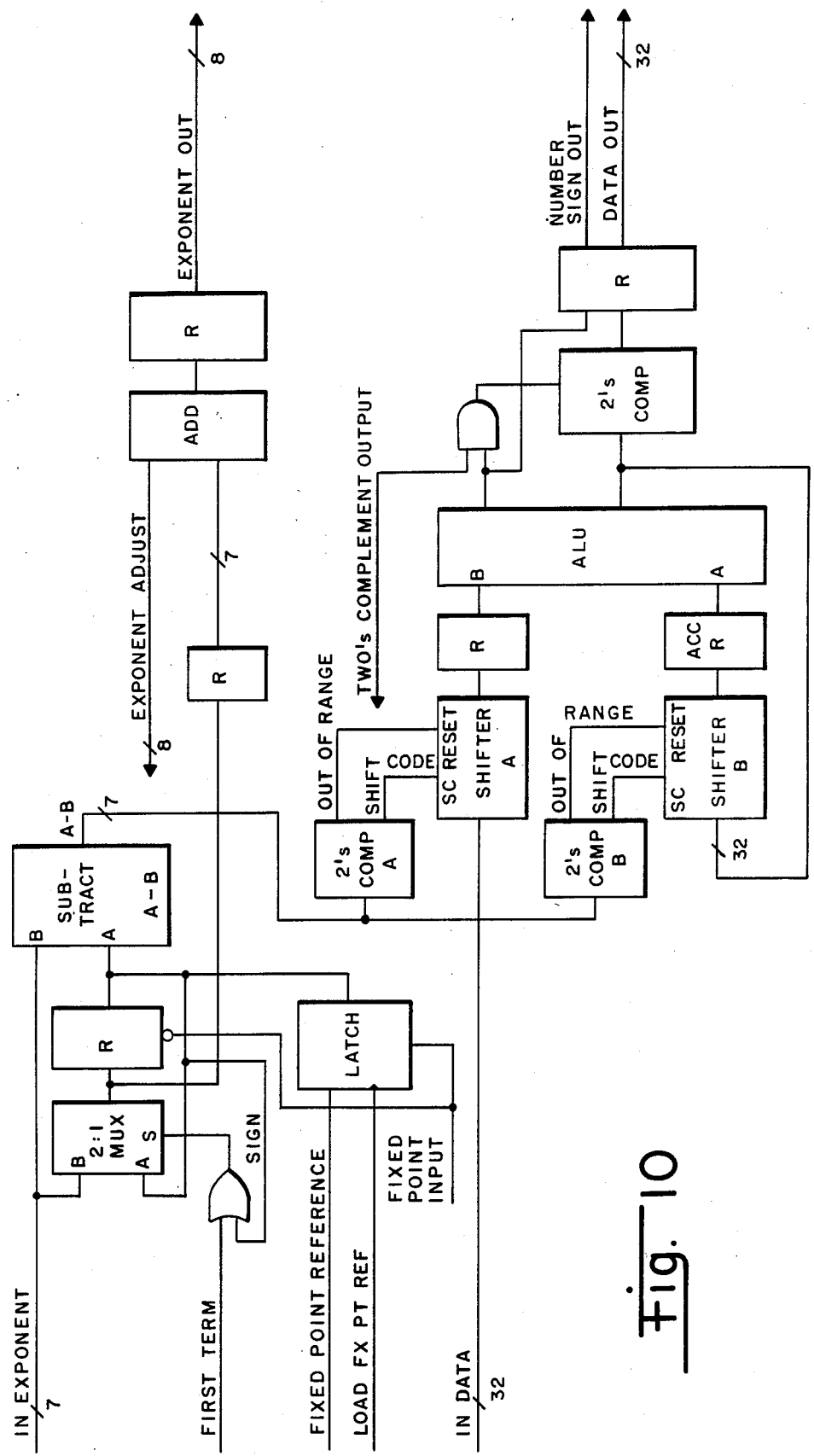
FIG. 10 is a functional block diagram showing floating point accumulator architecture.

FIG. 10 is a simplified diagram of the floating point acculator architecture.

Notes for floating point inputs:
If A minus B is less that zero, enable 2's complement B and shift shifter B.
If A minus B is greater than or equal to zero, shift shifter A.

For fixed point input:
If A minus B is less that zero, enable 2's complement A and shift shifter A.
If A minus B is greater than or equal to zero, shift shifter A.

APPENDIX

Attached hereto as an appendix and incorporated by reference is a set of drawings and programming documents for the Arithmetic Pipelene as used in an experimental advanced visual training system.

The set of drawings for five boards are:
63D722600—Transform (9 sheets).
63D722601—Log Calculation (9 sheets).
63D722602—PWB, Floating to Fixed Point (10 sheets).
63D722603—ALU 36 Bits (9 sheets).
63D722604—Fixed to Floating Point Conversion (9 sheets).

The programming documents are firmware programs as follows:
1. PAL: 63A140936 (sheets 2 and 27)
   program 27 on board 63D722601
2. FPLA: 63A140931 (sheets 2, 13, 23, 24, 6 & 7)
   program 01A on board 63D722601
   02A on board 63D722601
   03A on board 63D722603
   04 on board 63D722604
3. PROM: 63A140928 (sheets 2-6 inclusive)
   program 01 on board 63D722601
4. PROM: 63A140923 (sheets 2-6 inclusive)
   program 01 on board 63D722602
   02 on board 63D722602
   03 on board 63D722602
5. PROM: 63A140930 (sheets 2-69 inclusive)
   program 02 thru 11 on board 63D722600
   (Note Firmware Program 01 is NOT used)

III-D. MAINTAINABILITY

Arithmetic Pipeline Test Buses

The Arithmetic Pipeline will have two bidirectional 32-bit test buses. Test bus A will go to the log boards and test bus b will go to the antilog boards. These buses can be used to inject or receive data to or from the Arithmetic Pipeline.

Parity

The parity of all outputs of each board will be output from each board to a parity collection memory. The parity of each board can be determined by the Arithmetic Pipeline Emulator.

IV. PROGRAMMING AND TABLES

IV-A. The Log and Antilog Curves

One way of approximating a curve is by a piecewise linear approximation. That is, use a large number of small line segments to approximate the curve. In this case 4096 line segments are used to approximate the curve. These line segments have an equation of the form:

$$\text{Output} = \beta(n)y + \alpha(n)$$

where
Y = 12 least significant bits
$\beta(n)$ = slope of line segment
n = index with range from 1 to 4096
$\alpha(n)$ = starting value of line segment
Since there are 4096 line segments there must be 4096 $\beta(n)$'s and 4096 $\alpha(n)$'s. Relating this to hardware, $\beta(n)$ is Prom Table 2, $\alpha(n)$ is Prom Table 1, and Y is the 12 least significant bits of the input.

The Taylor Series expansion can be used to calculate $\alpha(n)$, $\beta(n)$, and accuracy of approximation. The Taylor Series expansion about the point Xo is:

$$f(Z) \approx f(Xo)(Z - Xo) + f'(Xo)\frac{(Z - Xo)^2}{2!}$$

Notice that f(X) corresponds to $\alpha(n)$ and f'(X), the derivative, corresponds to the slope $\beta(n)$.

In the case of the $\log_2$ curve $$f(X) = \frac{\text{Log}(X)}{\text{Log } 2}$$

$$f'(X) = \frac{1}{X \text{ Log } 2}$$

So the Taylor Series about the point Xo is $$f(Z) = \frac{\text{Log}(Xo)}{\text{Log } 2} + \frac{Z - Xo}{Xo \text{ Log } 2}$$

If there are 4096 line segments, there are 4096 Taylor Series approximations to the curve. Each Taylor Series for each of the 4096 segments of the curve are evaluated about the point that corresponds to the beginning of each segment of the curve.

Let input = 1.+X+Y where
1. is the implied one
X = 12 most significant bits and X<1
Y = 12 least significant bits and Y<1+X
The 1+X is the starting point of each segment of the curve:

$$f(Z) = \frac{\text{Log }(1 + X)}{\text{Log } 2} + \frac{Z - (1 + X)}{(1 + X) \text{ Log } 2}$$

The input to the series is Z
Let $Z = 1 + X + Y$

Then $$f(1 + X + Y) = \frac{\text{Log}(1 + X)}{\text{Log } 2} + \frac{Y}{(1 + X)\text{Log } 2}$$

Let Input = $1 + X + Y$ $$\frac{\text{Log }(1 + X)}{\text{Log } 2} = \alpha(n)$$

$$\frac{1}{(1 + X)\text{Log } 2} = \beta(n)$$

then $$f(\text{Input}) = \text{Log}_2(\text{Input}) = \alpha(n) + \beta(n)Y$$

The error is approximately the third term in the Taylor Series.

$$\text{ERROR} \leq f'' \frac{(Xo)(Z - Xo)^2}{2}$$

$$\text{ERROR} \leq \frac{-1}{Xo^2} \frac{(Z - Xo)^2}{2}$$

Let
$Xo = 1 + X$ $Z = 1 + X + Y$ $$\text{ERROR} \leq \frac{1}{(1 + X)^2} \cdot \frac{(Y)^2}{2}$$

For the Antilog the input is $Z = X + Y$ $$f(X+Y) = 2^{X+Y} = e^{Ln2(X+Y)} = e^{Ln2X}e^{Ln2Y}$$

The Taylor Series of $e^Z$ is $$e^Z = 1 + Z + \frac{Z^2}{2}$$

Let $Z = Ln2Y$
Substitute $$f(X + Y) = e^{Ln2X}(1 + Ln2Y)$$

$$f(X + Y) = e^{Ln2X} + (e^{Ln2X}Ln2)Y$$

Let $\alpha(n) = e^{Ln2X}$ and $\beta(n) = Ln2 e^{Ln2X}$
Then $A\text{Log}(X+Y) = \alpha(n) + \beta(n)Y$ The ERROR is $$\text{ERROR} \leq \frac{e^{Ln2X}(Ln2Y)^2}{2}$$

ERROR calculation for log $$E \leq \frac{1}{(1 + X)^2} \cdot \frac{Y^2}{2}$$

Min value of $X = 0$

Min value of $Y = 2^{-12} - 2^{-24}$ $E \leq 2.9787772 \times 10^{-8}$

This is an error $\leq 2^{-25}$
Error calculation for Alog $$E \leq \frac{e^{Ln2X}(Ln2Y)^2}{2}$$

Max value of $X = 1 + 2^0 - 2^{-12}$

Max value of $Y = 2^{-12} - 2^{-24}$ $E \leq 5.7256186 \times 10^{-8}$ $E \leq 2^{-24}$ At first this error would seem good enough, however, there are other errors such as truncation errors. To assure that the best possible error is obtained, the two following programs make the best possible fit of each line segment to the curve. An error of $\pm 1$ LSB was obtained for the log and antilog transforms.

Accuracy of multiplication
Assume input is accurate to $\pm \frac{1}{2}$ LSB
Transform each multiplicant Error $\leq \pm 1\frac{1}{2}$ LSB
Add both inputs Error = $\pm 3$ counts or 2 bits Antilog error $\leq 2^{(1-2-24-(2-23+2-24))} \pm 1$ LSB Total Error $\leq 3.3 \times 10^{-7} \pm 1$ LSB = 7 counts or 3 bits

IV-B. Program For Generating Prom Tables

```
C THIS PROGRAM GENERATES PROM TABLES 1 AND 2 FOR THE FIG. 5 BOARD.
C THIS PROGRAM WILL GENERATE PROM TABLES FOR ANY FUNCTION.
C THE ONLY RESTRICTIONS ON THE FUNCTION ARE THAT THE FUNCTION MUST
C HAVE A MAXIMUM SLOPE OF LES THAN TWO OVER THE RANGE TO BE USED.
C AND THE FUNCTION MUST BE SMOOTH OVER THE RANGE TO BE USED
C THE BLOCK DIAGRAM IS FIG. 4
C THE INPUTS FOR THIS PROGRAM ARE: THE INPUT SCALING, OUTPUT
C SCALING, AND AN EQUATION OF THE FUNCTION.
C      NF1  = NUMBER OF FRACTIONAL BITS IN THE INPUT
C      NF2  = INTEGER NUMBER OF FRACTIONAL BITS IN THE OUTPUT
C      W1   = WEUGHT OF EACH BIT IN THE INPUT
C      W2   = WEUGHT OF EACH BIT IN THE OUTPUT
C      F(X) = THE FUNCTION EQUATION
C      PDATA = FILE NAME OF PROM DATA
C
C
       INTEGER*4  IX, IX1, IY, ISUMF, IERRF, IERRF1, IXF1, IY1F
       DOUBLE PRECISION X, X1NF1, W1, W2,ALPHA,BETA,TWO,STEP,EXACT,NF2
     +  ,SHIFT
```

```
C
C
C*****************************************
        TWO = 2.0
        NF1 = 24.0
        NF2 = 24.0
        W1  = 1.0
        W2  = 1.0
C*****************************************
C
C
        STEP = 1/ (T.O**(FF1-12.0))
        OPEN(UNIT=42,NANE='LDATA.DAT',TYPE='NEW')
        ITOPLMAX=0
        SHIFT =TWO**NF2/F2
        ALPHA = 0.0
        DO 10 I=0,4095
C
C*****************************************
C
        X = DLOG(1.0+ALPHA)/DLOG(TWO)
C
C*****************************************
C
        X1 = DLOG(1.0+ALPHA+STEP)/DLOG(TWO)
C
C*****************************************
C
C CONVERT X AND X1 TO INTEGERS
C
C
C
        X = X*SHIFT
        X1 = X1*SHIFT
        IX = X
        IX1 = X1

IF(X.GE.16777216.0)1X = 'FFFFFF'X
        IF(X1 .GE.16777216.0)IX1 = 'FFFFFF'X
C
C CALCULATE SLOPE
C
        IY = IX1-1X
        IF(IY .GE.'100000'X(1Y = 'FFFFF'X
        IF(IY.LE.'0'X)IY = '0'X
        IY = JISHFT(I),11)
        IY = IY/'FFF'λ
D       WRITE(50,201)λ,X1,IX,IX1,IY
D201    FORMAT(1X,F15,8,F15,8,Z10,Z10,Z10)
C
C NOW ADJUST IX AND IY TOI FIT THE ACTUAL CURVE THE BEST
C
C
        IFLAG = 0
        IXI = IX
        IYI = IY
        CALL ADJUST(W1,IYI,IX,NF1,ALPHA,INERRF, ISUMF, W2
     +  ,NF2,IYF)
40      ISUMF1 = ISUMF
        IERRF1 = IERRF
        IFLAG = IFLAG + 1
        IY1F = IYF
        IF(IX.LT.'FFFFFF'X)IX = IX+1
        CALL ADJUST(W1,1Y1,1X,NF1,ALPHA,IERRF,ISUMF,W2
```

```
      +   ,NF2,IYF)
          IF(IERRF1 .GT. IERRF)GO TO 40
          IF(IERRF1 .NE. IERRF)GO TO 50
          IF(ISUMF1 .GT. ISUMF)GO TO 40

50        ISUMF=ISUMF1
          IYF = IY1F
          IERRF = IEPRF1
          IXF1 = IX - 1
          IX = IXI
99        ISUMF1 = ISUMP
          IERRF1 = IERPF
          IY1F = IYF
          TXF = IXF1
          IF(IFLAG .G1. GO TO 51
          IF(IX.G1.0)IX = IX-1
          CALL ADJUST(W1,IYI,IX,NF1,ALPHA,IERRF,ISUMF,W2
      +   ,NF2,IYF)
          IXF1 = IX+1
          IF(IERRF1 .GT. IERRF)GO TO 99
          IF(IERRF1.NE. IERRF)GO TO 51
          IF(ISUMF1 .GT. ISUMF)GO TO 99
          IF(IY1F .LT. 0)IY1F=IOR((.NOT.IY1F)+1,'8000'X)
51        ALPHA = ALPHA + STEP
          WRITE(42,100)IXF,IY1F
100       FORMAT(1X,Z6,10X,X3)
          IF(IERRF1 .GT.ITOTLMAX)ITOTLMAX = IERRF1
10        CONTINUE
          WRITE(60,401)1TOTLMAX
401       FORMAT(1X,'TOTAL MAXIMUM ERROR =',Z10)
          STOP
          END
C
C*****************************************
C
C   SUBROUTINE TO ADUST SLOPE
C
C   THIS SUBROUTINE TAKES INPUTS W1,IYI,NF1,ALPHA AND OUTPUTS THE SLOPE
C   IYF WITH THE BEST ERROR, IFRRF AND THE BEST SUM ERROR, ISUMF"
C
          SUBROUTINE ADJUST(W1,IYI,IX,NF1,ALPHA,IERRF,ISUME,W2
      +   ,NF2,IYF)
          INTEGER*4 IYI,IY,IX,IEXACI,ITESI,ISUMERR,JYF,ISUMF,IERRF1,ISUMF1
      +   MXERR,IBETA
          DOUBLE PRECISION W2,SHIFT,NF2,W1,NF1,ALPHA,EXACT,TWO,ONE,BETA
C
C   CALULATE ERROR
C
C
          TWO = 2.0
          ONE = 1.0
          IY = IYI
          BETA = 0.0
          IBETA = 0
          MXERR=0
          ISUMERR=0
          SHIFT = TWO**(NF2+1)/W2
          DO 90 J=1,4095

C   CALCULATE THE BASELINE ERROR AND SUM ERROR
C_____
C
          EXACT= DLUG(1.0+ALPHA+BETA)/DLOG(TWO)
```

```
C
C_____
C
C   CONVERT TO INTEGER
C
      IEXACT = EXACT*SHIFT
C
      ITEST = IX + (IY*BETA)/'800'X
      IERR = IEXACT - JISHFT(ITEST,1)

IF(IERR.LE.0)IERR = (.NOT.IERR) + 1
C
      ISUMERR = ISUP+IERR
C
      IF(IERR .GT. MXERR)MXERR = IERR

IBETA = IBETA + 1
      BETA = BETA ++ W1/(TWO**NF1)
  90  CONTINUE
D     WRITE(50,101)IX,IY,MXERR,YSUMERR
D101  FORMAT(1X,Z10,,Z10,Z10,Z10)
C
C   INITIALIZE VARIABLES
C
      IFLAG = 0
      IERRI = MXERR
      ISUMI = ISUMERR

C  IERR1 IS THE PREVIOUS ERROR
C  ISUM1 IS THE PREVIOUS SUM ERROR
C  MXERR IS THE PRESENT ERROR
C  ISUMERR IS THE PRESENT SUM ERROR
C  IYF IS THE PRESENT SLOPE
C  IYF1 IS THE PREVIOUS SLOPE
C
 30   IERR1 = MXERR
      ISUM1 = ISUMERR
      IFLAG = JFLAG + 1
      IF(IY.LT.'FFF')IY = IY + 1
C
      BETA = 0.0
      IBETA = 0
      MXERR=0
      ISUMERR=0
      DO 20 J=1,4095

C
C---------------------------------
C
      EXACT= DLOG(1.0+ALPHA+BETA)/DLOG(TWO)
C
C---------------------------------
C
C   CONVERT TO INTEGER
C
      IEXACT = EXACT*SHIFT
C
      ITEST = IX + (IY*1BETA)/'800'X
      IF(ITEST .GT. 'FFFFFF'X)GO TO 25
      IERR = IEXACT - JISHFT(ITEST,1)
      IF(IERR.LE.0)IERR = (.NOT.IERR) +1
C
      ISUMERR = ISUMERR+IERR
```

```
C
      IF(IERR .GT. MXERR)MXERR = IERR
C
      IBETA = IBETA + 1
      BETA = BETA + W1/ (TWO**NF1)
 20   CONTINUE
D     WRITE(50,102)IY,MXERR,ISUMERR
D102  FORMAT(1X,Z10,Z10,Z10)
      IF(IERR1 .GT. _____ERR)GO TO 30
      IF(IERR1 .NE. _____RR)GO TO 25
      IF(ISUM1) .GT. ISUMERR)GO TO 30
 25   IYF = IY -1
      IF(IFLAG .GT.1)GO TO 12
C
C  INITIALLIZE VARIABLES
C
      IY = IYI
      MXERR = IERRI
      ISUMERR = ISUMI

70   IERR1 = MXERR
      ISUM1 = ISUMERR
      BETA = 0.0
      IBETA =0
      MXERR=0
      ISUMERR=0
      IF(IY.GT.0)IY = IY-1
      DO 80 J=1,4095

C
C-----------------------------------------
C
      EXACT=DLOG(1.0+ALPHA+BETA)/DLOG(TWO)
C
C-----------------------------------------
C
C  CONVERT TO INTEGER
C
      IEXACT = EXACT*SHIFT
C
      ITEST = IX + (IY*IBETA)/'800'X
      IF(ITEST .LT. 0)GO TO 26
      IERR = IEXACT - JISHFT(ITEST,1)

IF(IERR.LE.0)IERR = (.NOT.IERR) + 1
C
      ISUMERR = ISUMERR+IERR
C
      IF(IERR .GT. MXERR)MXERR = IERR

IBETA = IBETA + 1
      BETA = BETA + W1/ (TWO**NF1)
 80   CONTINUE
D     WRITE(50,102)IY,MXERR,ISUMERR

IF(IERR1 .GT. MXERR)GO TO 70
      IF(IERR1 .NE. MXERR)GO TO 26
      IF(ISUM1 .GT. ISUMERR)GO TO 70
 26   IYF = IY + 1
 12   IERRF = IERR1
      ISUMF = ISUM1
      RETURN
      END
```

```
C****************************************************
C   THIS PROGRAM CONVERTS A FPLA TO A 2K X 8 PROM
C
      IMPLICIT INTEGFR(A-Z)
      DIMENSION PROM(0:1023)
C
C   DESCRIBE FPLA
C
      DO 1 I=0,1023
      ACNT1 = JISHFT(1AND(I,'200'X),-9)
      ACNT0 = JISHFT(IAND(I,'100'X0,-8)
      SGMA  = JISHFT(IAND(I,'80'X),-7)
      SGMB  = JISHFT(IAND(I,'40'X),-6)
      CLRA  = JISHFT(IAND(I,'20'X),-5)
      CLRB  = JISHFT(IAND(I,'10'X),-4)
      ASEL1 = JISHFT(1AND(I,'8'X),-3)
      ASEL0 = JISHFT(IAND(I,4),-2)
      BSEL1 = JISHFT(IAND(I,2),-1)
      BSEL0 = IAND(I,1)
      S3 = ACNT1.AND.ACNT0
      S2 = ((.NOT.ACNT1).AND.(.NOT.ACNT0))
   +  .OR.(ACNT0.AND.(.NOT.ACNT1))
   +  .OR.(ACNT1.AND.ACNT0)
      S1 = ((.NOT.ACNT0).AND.ACNT1)
   +  .OR.((.NOT.ACNT1).AND.(.NOT.ACNT0))
   +  .OR.(ACNT1.AND.ACNT0)
      CIN =((.NOT.ACNT1).AND.ACNT0)
   +  .OR.((.NOT.ACNT0).AND.ACNT1)
      AMB=(ACNT0.AND.(.NOT.ACNT1))
   +  .OR.( ACNT1.AND.ACNT0)
      BMA = (ACNT1.AND.ACNT0)
   +  .OR.((.NOT.ACNT0).AND.ACNT1)
      PUP = 1
      SGM = (ACNT1.AND.ACNT0)
   +  .OR.(CLRA.AND.CLRB)
   +  .OR.((.NOT.ASEL0).AND.(.NOT.ASEL1).AND.(.NOT.BSEL0).AND.
   +  (.NOT.BSEL1)
   +  .OR.((.NOT.SGNA).AND.(.NOT.SGNB))
   +  .OR.((.NOT.SGNE).AND.CLRA)
   +  .OR.((.NOT.SGNA).AND.CLRB)
   +  .OR.((.NOT.SGNB).AND.(.NOT.ASEL1).AND.(.NOT.ASEL0))
   +  .OR.((.NOT.SGNA).AND.(.NOT.BSEL1).AND.(.NOT.BSEL0))
   +  .OR.(SGNA.AND.SGNB.AND.(.NOT.CLRA).AND.(.NOT.CLRB)
   +  .AND.ASEL1.AND.BSEL1)
   +  .OR.(SGNA.AND.SGNB.AND.(.NOT.CLRA).AND.(.NOT.CLRB)
   +  .AND.ASEL0.AND.BSEL0)
   +  .OR.(SGNA.AND.SGNB.AND.(.NOT.CLRA).AND.(.NOT.CLRB)
   +  .AND.ASEL1.AND.BSEL0)
   +  .OR.(SGNA.AND.SGNB.AND.(.NOT.CLRA).AND.(.NOT.CLRB)
   +  .AND.ASEL0.AND.BSEL1)
      SGN = .NOT.SGN
      S3=IAND(S3,1)
      S2=IAND(S2,1)
      S1-IAND(S1,1)
      CIN=IAND(CIN,1)
      AMB=IAND(AMB,1)
      BMA=IAND(BMA,1)
      SGM-IAND(SGN,1)
```

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

What is claimed is:

1. Apparatus comprising an arithmetic pipeline (having no central processing unit or software in itself) for image processing for solving an equation of the form $$\sum_{i=1}^{K} +/- (A_i^{mi} \times / \div B_i^{ni})$$

which indicates the summation of K terms having integer values of i from 1 to K inclusive, where, $A_i$ and $B_i$ are each an N-bit implied one floating point number consisting of a sign bit, an exponent of P bits, and a data part of Q bits; $m_i$ and $n_i$ can each take on a value selected from zero, given positive integral powers of two, and 1 divided by given positive integral powers of two; $+/-$ indicates a summing operation which is either an add or a subtract for each value of i, and $\times/\div$ indicates a product operation which is either a multiply or a divide for each value of i;

wherein said apparatus comprises a log section and a separate floating point section;

the log section comprises two log-transform units A and B for A and B inputs respectively, a log-sum-or-difference unit having A and B inputs coupled respectively to outputs of the log-transform units A and B, and an antilog-transform unit having an input from the log-sum-or-difference unit and an output to the floating point section;

the two log-transform units being identical, each having read-only memory with tables therein, and associated registers, logic and arithmetic circuits, for transforming an input floating point number into a log format in which the exponent becomes a characteristic and the data part becomes a mantissa, a plurality of the registers being coupled in tandem to repeat with delay the (1+P) bits of the sign and exponent to provide the sign and characteristic for output to the log-sum-or-difference unit, the Q bits of the dta part being converted to the mantissa by a piecewise linear approximation based on values stored in said tables, the resulting mantissa being transferred to the log-sum-or-difference unit;

the log-sum-or-difference unit having an A shifter to which is supplied an A log value comprising the combination of the characteristic and mantissa from the A log-transform unit, and a separate B shifter to which is supplied a B log value comprising the combination of the characteristic and mantissa from the B log-transform unit, means for controlling the shifters to shift each of said A and B log values an amount depending on the value of $m_i$ for the A shifter and $n_i$ for the B shifter to provide resulting A and B log values in the A and B shifters respectively, arithmetic logic means coupled to the A and B shifters for adding or subtracting the resulting A and B log values depending on whether the product operation is multiply or divide for the value of i to provide a log sum, and number sign means for determining the number sign of said log sum depending on the number signs of the A and B log values;

wherein the antilog-transform unit comprises structure like that of the log-transform units, having read-only memory with tables therein, and associated registers, logic and arithmetic circuits, for transforming said log sum from the log-sum-or-difference unit into a floating point number in which the characteristic becomes an exponent and the mantissa becomes a data part, a plurality of the registers being coupled in tandem to repeat with delay the (1+P) bits of the sign and characteristic to provide a sign and exponent for said floating point number, the Q bits of the mantissa being converted to a data part for said floating point number by a piecewise linear approximation based on values stored in said tables of the antilog-transform unit, corresponding to the piecewise approximation used in the log transforms, the resulting floating point number comprising said sign and exponent with said data part being transferred along with said sign and exponent to the floating point section;

the floating point section comprises a float-to-fixed unit, a M-bit arithmetic logic unit, and fixed-to-float unit;

wherein the float-to-fixed unit comprises means including a shifter, registers, logic and arithmetic circuits, for converting said floating point number from the antilog-transform unit into a fixed point number having a binary number point, and for aligning the binary points of the fixed point numbers for terms with successive values of i, with input from the antilog transform unit and output to the M-bit arithmetic logic unit;

wherein the M-bit arithmetic logic unit comprises means to accumulate successive terms to form an accumulated M-bit number, taking account of the number sign of each term, with output of the accumulated M-bit number to the fixed-to-float unit, M being an integer greater than N;

and wherein the fixed-to-float unit comprises means for converting the accumulated M-bit number from the M-bit arithmetic logic unit to a floating point format.

2. Apparatus according to claim 1, wherein in each log transform unit the input of the data part of Q bits is split into a first part comprising R most significant bits having a value X and a second part comprising S least significant bits having a value Y, the sum of R and S being Q;

wherein said read-only memory of each log transform unit comprises a first memory of $2^R$ words of Q bits each for a table storing values alpha, and a second memory of $2^R$ words of less than Q bits each for a table storing values beta, the values alpha being values of the mantissa at points Xn, and the values beta being the slopes of the mantissa between the points Xn and X(n+1), said first part of R bits being used to address both the first and the second memory;

wherein said logic and arithmetic circuits of the log transform unit include a multiplier and an arithmetic logic device, the multiplier having one data input for the values beta from the second memory and another input for said second part of S bits, the multiplier having a data output of more than S bits forming a product of the data at the two inputs;

said arithmetic logic device having one data input for values alpha from the first memory and a second data input from the multiplier, the arithmetic logic device being used to add the values of the data at its two inputs and to supply a resulting value to an output of Q bits.

3. Apparatus according to claim 2, wherein R is equal to S, the words in the second memory have S bits, and the output of the multiplier has S+1 bits; wherein the registers and the multiplier each have a clock input, wherein the registers of each log transform unit include three registers in tandam, each comprising P+1 bistable devices, coupled between unit inputs and outputs for the sign bit and the exponent, the last of the three being an output register; two registers of Q bistable devices each coupled in tandem between the output of the first memory and the first data input of the arithmetic logic device; and one output register of Q bistable devices coupled between the output of the arithmetic logic device and Q data output leads from the unit;

a unit clock input for clock signals coupled to the clock inputs of the first two of the three registers for the sign bit and exponent, to the clock input of the multiplier, and to the clock inputs of the two registers coupled from the output of the first memory; and a "load output register" input gated with the unit clock input and supplied to clock inputs of the two output registers.

4. Apparatus according to claim 3, wherein said log-sum-or-difference unit further includes out-of-range-detection means for for determining that the result of the operation of the unit produces a number out of range for an N-bit number and clamps the output to the closest value within range; special-case-detection means for detecting special cases comprising divide by zero, zero divided by zero, zero divided by a non-zero number, multiply by zero, or an illegal exponent, and in response thereto clamping the output to the maximum value for divide by zero and to zero for the other said special cases;

wherein the number sign means, out-of-range-detection means, and special-case-detection means, are formed by read-only memory and logic array means programmed to perform said operations.

* * * * *

UNITED STATES PATENT AND TRADEMARK OFFICE
CERTIFICATE OF CORRECTION

PATENT NO. : 4,700,319

DATED : October 13, 1987

INVENTOR(S) : Walter R. Steiner

It is certified that error appears in the above-identified patent and that said Letters Patent is hereby corrected as shown below:

Col 4, line 60, insert --I-C. Data Type Formats--.

Col 6, line 62, "ffffff" should be --FFFFFF--.

Col 9, line 47, "whost" should be --whose--.

Col 11, line 11, insert --Inputs OD and SET are grounded (and therefore remain low)--.

Col 18, line 42, "f" in equation should be --f'--.

Col 19, line 15, in the equation "f' " should be --f"--.

Signed and Sealed this

Seventeenth Day of May, 1988

Attest:

DONALD J. QUIGG

Attesting Officer

Commissioner of Patents and Trademarks